US008494827B2

(12) United States Patent
Mutlu et al.

(10) Patent No.: US 8,494,827 B2
(45) Date of Patent: Jul. 23, 2013

(54) METHOD OF PREDICTING NATURAL FRACTURES AND DAMAGE IN A SUBSURFACE REGION

(75) Inventors: Ovunc Mutlu, Houston, TX (US); Ganeswara Rao Dasari, Houston, TX (US); Rodrick D. Myers, Houston, TX (US)

(73) Assignee: ExxonMobil Upstream Research Company, Houston, TX (US)

( * ) Notice: Subject to any disclaimer, the term of this patent is extended or adjusted under 35 U.S.C. 154(b) by 551 days.

(21) Appl. No.: 12/785,186

(22) Filed: May 21, 2010

(65) Prior Publication Data

US 2011/0077918 A1    Mar. 31, 2011

Related U.S. Application Data

(60) Provisional application No. 61/245,730, filed on Sep. 25, 2009.

(51) Int. Cl.
*G06G 7/48* (2006.01)

(52) U.S. Cl.
USPC .......................................................... 703/10

(58) Field of Classification Search
USPC .......................................................... 703/10
See application file for complete search history.

(56) References Cited

U.S. PATENT DOCUMENTS

| | | | |
|---|---|---|---|
| 4,783,769 A | 11/1988 | Holzhausen et al. |
| 5,144,591 A | 9/1992 | Hardage |
| 5,574,218 A | 11/1996 | Withers |
| 5,661,698 A | 8/1997 | Cacas |
| 5,838,634 A | 11/1998 | Jones et al. |
| 5,963,508 A | 10/1999 | Withers |
| 5,996,726 A | 12/1999 | Sorrells et al. |
| 6,035,255 A | 3/2000 | Murphy et al. |

(Continued)

FOREIGN PATENT DOCUMENTS

| WO | WO 99/04292 | 1/1999 |
|---|---|---|
| WO | WO 99/53342 | 10/1999 |

(Continued)

OTHER PUBLICATIONS

Bai et al. (including Pollard); Spacing of edge fractures in layered materials; International Journal of Fracture 103: 373-395, 2000.*

(Continued)

*Primary Examiner* — Hugh Jones
(74) *Attorney, Agent, or Firm* — ExxonMobil Upstream Research Company Law Dept.

(57) ABSTRACT

A method for predicting localized damage and naturally occurring fractures in a subsurface region is provided. This invention uses a hybrid FEM-DEM (i.e. finite-discrete element) framework combined with a fracture risking analysis and fracture initiation and propagation criteria, to model the transition of rock from a state of continuum to discontinuum. The risking analysis combines results from other natural fracture prediction tools (e.g. displacement discontinuity method, restoration analysis, curvature analysis, analytical solutions, continuum analysis) to augment FEM-DEM solutions, such as by providing remote and local boundary conditions and identifying potential regions of anticipated damage and fracturing. Natural fractures and damage information is extracted from the modeling results and may be used directly for predictions or used as input into other fracture analysis tools or techniques. The FEM-DEM and risking techniques can be incorporated into a variety of numerical simulation software packages that use a finite-discrete method solver.

21 Claims, 10 Drawing Sheets

U.S. PATENT DOCUMENTS

| | | | |
|---|---|---|---|
| 6,052,650 | A | 4/2000 | Assa et al. |
| 6,370,491 | B1 | 4/2002 | Malthe-Sorenssen et al. |
| 6,549,854 | B1 | 4/2003 | Malinverno et al. |
| 6,684,159 | B2 | 1/2004 | Khan et al. |
| 6,749,022 | B1 | 6/2004 | Fredd |
| 6,813,592 | B1 | 11/2004 | Dhondt |
| 6,826,483 | B1 | 11/2004 | Anderson et al. |
| 6,928,367 | B2 | 8/2005 | Gray et al. |
| 6,938,693 | B2 | 9/2005 | Boney et al. |
| 6,941,255 | B2 | 9/2005 | Kennon et al. |
| 6,968,274 | B2 | 11/2005 | Tutuncu et al. |
| 7,043,310 | B2 | 5/2006 | Polz et al. |
| 7,047,165 | B2 | 5/2006 | Balaven et al. |
| 7,349,807 | B2 | 3/2008 | Moos et al. |
| 7,509,245 | B2 | 3/2009 | Siebrits et al. |
| 7,529,624 | B2 | 5/2009 | Castillo et al. |
| 7,630,914 | B2 | 12/2009 | Veeningen et al. |
| 2002/0013687 | A1 | 1/2002 | Ortoleva |
| 2006/0129366 | A1 | 6/2006 | Shaw |
| 2006/0153005 | A1 | 7/2006 | Herwanger et al. |
| 2006/0219402 | A1 | 10/2006 | Lecampion |
| 2007/0272407 | A1 | 11/2007 | Lehman et al. |
| 2008/0015780 | A1 | 1/2008 | Dimri et al. |
| 2008/0091396 | A1 | 4/2008 | Kennon et al. |
| 2008/0183451 | A1 | 7/2008 | Weng et al. |
| 2008/0190603 | A1 | 8/2008 | Brannon |
| 2008/0234988 | A1 | 9/2008 | Chen et al. |
| 2009/0090505 | A1 | 4/2009 | McDaniel et al. |
| 2009/0116338 | A1 | 5/2009 | Hoetz |
| 2009/0119076 | A1 | 5/2009 | Madatov et al. |
| 2009/0125280 | A1 | 5/2009 | Soliman et al. |
| 2009/0177417 | A1 | 7/2009 | Yonemura et al. |
| 2009/0235729 | A1 | 9/2009 | Barthelemy et al. |
| 2009/0248374 | A1 | 10/2009 | Huang et al. |

FOREIGN PATENT DOCUMENTS

| | | |
|---|---|---|
| WO | WO 2009/029133 | 3/2009 |
| WO | WO 2009/029135 | 3/2009 |
| WO | WO 2009/048781 | 4/2009 |
| WO | WO 2009/070365 | 6/2009 |
| WO | WO 2009/108432 | 9/2009 |
| WO | WO 2009/126375 | 10/2009 |
| WO | WO 2009/139949 | 11/2009 |

OTHER PUBLICATIONS

Bobet et al. (including Mutlu): Stress and displacement discontinuity element method for undrained analysis; Engineering Fracture Mechanics 72 (2005) 1411-1437.*

Eberhardt et al.; Hybrid finite-discrete-element modelling of progressive failure in massive rock slopes; ISRM 2003—Technology roadmap for rock mechanics, South African Institute of Mining and Metallurgy, 2003; pp. 275-280.*

Elmo: Evaluation of a hybrid FEM/DEM approach for determination of rock mass strength using a combination of discontinuity mapping and fracture mechanics modelling, with particular emphasis on modelling of jointed pillars; PhD Thesis; School of Geography, Archaeology and Earth Resources, University of Exeter; Mar. 2006; pp. 1-282.*

Maerten et al (including Pollard): Inverting for slip on three-dimensional fault surfaces using angular dislocations; "Inverting for slip on three-dimensional fault surfaces usingangular dislocations" Bulletin of the Seismological Society of America 95.5 (2005): 1654-1665.*

Maerten et al.; Chronologic modeling of faulted and fractured reservoirs using geomechanically based restoration: Technique and industry applications; AAPG Bulletin, V. go, No. 8 (Aug. 2006), pp. 1201-1226.*

Rehermann; Modeling Rock Folding With Large Deformation Frictional Contact Mechanics; ProQuest Dissertations and Theses; 2008; ProQuest Dissertations & Theses; pp. 1-222.*

Sfantos et al.; Multi-scale boundary element modelling of material degradation and fracture; Comput. Methods Appl. Mech. Engrg. 196 (2007) 1310-1329.*

Sanz et al.; Mechanical aspects of thrust faulting driven by far-field compression and their implications for fold geometry; Acta Geotechnica (2007) 2:17-31; pp. 17-31.*

Nishioka et al.; An Evaluation of Several Moving Singularity Finite Element Models for Fast Fracture Analysis; Engineering Fracture Mechanics vol. 15, No. 1-2, pp. 205-218, 1981.*

Allwardt P.F., et al., Curvature and Fracturing Based on Global Positioning System Data Collected at Sheep Mountain Anticline, Wyoming (In Unlocking 3D Earth Systems; Harnessing New Digital Technologies to Revolutionize Multi-Scale Geological Models, 2007, Geosphere, vol. 3, No. 6, pp. 408-421.

Álvarez-Gómez, J. A., et al., Constraints From Finite Element Modeling on the Active Tectonics of Northern Central America and the Middle America Trench, 2008, Tectonics, vol. 27, TC1008, 12 pp.

Asgian, M.I., et al. 1995. Mechanical Stability of Propped Hydraulic Fractures: A Numerical Study, 1995, Journal of Petroleum Technology, vol. 47, No. 3, pp. 203-208.

Beekman, F., et al., Faulting, Fracturing and In-Situ Stress Prediction in Hydrocarbon Reservoirs: A Finite Element Approach, 2000, Tectonophysics vol. 320, pp. 311-329.

Bell, et al., The Use of Borehole Breakouts in the Study of Crustal Stress, 1983, Hydraulic Fracturing Stress Measurements, National Academy Press, pp. 201-209.

Bergbauer, S., et al., How to Calculate Normal Curvatures of Sampled Geological Surfaces, 2003, Journal of Structural Geology, vol. 25, No. 2, pp. 277-289.

Bergbauer, S., et al., A New Conceptual Fold-Fracture Model Including Prefolding Joints, Based on Field Data From the Emigrant Gap Anticline, Wyoming, 2004, Geological Society of America Bulletin, vol. 116, No. 3-4, pp. 294-307.

Bulnes, M., et al., 1999, Benefits and Limitations of Different 2D Algorithms Used in Cross-Section Restoration of Inverted Extensional Faults: Application to Physical Experiments, 1999, Tectonophysics, vol. 312, pp. 175-189.

Coelho, L.C., et al., Wellbore Stability Analysis in Porous Carbonate Rocks Using Cap Models, 2004, Structures and Materials, vol. 14, pp. 265-274.

Cottrell M.G., et al., 2003. Numerical Modeling of Ceramics Subject to Impact Using Adaptive Numerical Discrete Element Techniques. Engineering Computations vol. 20, (1), pp. 82-106.

Couples, Gary D., et al., Kinematics of Experimental Forced Folds and Their Relevance to Cross-Section Balancing, 1994, Tectonophysics, vol. 233, pp. 193-213.

Crook, T., et al., Computational Modeling of the Localized Deformation Associated With Borehole Breakout in Quasi-Brittle Materials. 2003, Journal of Petroleum Science and Engineering, vol. 38, pp. 177-186.

Crouch, S.L., et al., Boundary Element Methods in Solid Mechanics: With Applications in Rock Mechanics and Geological Engineering. 1983, George Allen & Unwin, London, pp. 79-109.

Dahlstrom, C.D.A., Balanced Cross Section, 1969, Canadian Journal of Earth Sciences, vol. 6, pp. 743-757.

Dula, W. F., Geometric Models of Listric Normal Faults and Rollover Folds, 1991, AAPG Bulletin, vol. 75, pp. 1609-1625.

E. Eberhardt, et al., Numerical Analysis of Initiation and Progressive Failure in Natural Rock Slopes—The 1991 Randa Rockslide, 2004, International Journal of Rock Mechanics and Mining Sciences, vol. 41, Issue 1, pp. 69-87.

Eidelman, A., et al., Fractured pebbles—A new stress indicator, 1992, Geology, vol. 20, pp. 301-304.

Ericsson, J. B., et al., Facies and Curvature Controlled 3D Fracture Models in a Cretaceous Carbonate Reservoir, in G. Jones, Q. J. Fisher, and R. J. Knipe, Eds., Faulting, Fault Sealing and Fluid Flow in Hydrocarbon Reservoirs, 1998, Geological Society Special Publication vol. 147, pp. 299-312.

Eshelby J.D. The Determination of the Elastic Field of an Ellipsoidal Inclusion and Related Problems, 1957, Proceedings of the Royal Society, vol. A241, pp. 376-396.

Fischer, M. P., et al., Predicting the Orientation of Joints From Fold Shape: Results of Pseudothree-Dimensional Modeling and Curvature Analysis, 2000, Geology, vol. 28, No. 1, pp. 15-18.

Foster, C.D., Modeling Brittle Fracture, Slip Weakening, and Variable Friction in Geomaterials With an Embedded Strong Discontinuity Finite Element, Department of Energy, Washington, DC. Report: SAND-2006-5920, pp. 88.

Gratier, J.-P., et al., Restoration and Balance of a Folded and Faulted Surface by Best Fitting of Finite Elements: Principle and Applications, 1991, Journal of Structural Geology, vol. 13, pp. 111-115.

Guiton, M. L. E., et al., Activation of Diffuse Discontinuities and Folding of Sedimentary Layers, 2003, Journal of Geophysical Research, vol. 108, B4, pp. 2183-2203.

Guiton, M. L. E., et al., Mechanical Constraints on the Chronology of Fracture Activation in Folded Devonian Sandstone of the Western Moroccan Anti-Atlas, 2003, Journal of Structural Geology, vol. 25, pp. 1317-1330.

Hauge, T. A., et al., A Critique of Techniques for Modeling Normal-Fault and Rollover Geometries, in P. G. Buchanan and D. A. Nieuwland, Eds., Modern Developments in Structural Interpretation, Validation and Modelling, 1996, Geological Society (London) Special Publication, vol. 99, pp. 89-97.

Hennings, P. H., et al., Combining Outcrop Data and Three-Dimensional Structural Models to Characterize Fractured Reservoirs: An Example From Wyoming, 2000, AAPG Bulletin, vol. 84, pp. 830-849.

Horii H. et al., Brittle Failure in Compression: Splitting, Faulting and Brittle-Ductile Transition Philosophical Transactions for the Royal Society of London. Series A, 1986, Mathematical and Physical Sciences, vol. 319, Issue 1549, pp. 337-374.

Ji, S., et al., A Revised Model for the Relationship Between Joint Spacing and Layer Thickness, 1998, Journal of Structural Geology, vol. 20, pp. 1495-1508.

Ji, S., et al., 1998b. Relationship Between Joint Spacing and Bed Thickness in Sedimentary Rocks: Effects of Interbed Slip, 1998, Geology Magazine, vol. 135, pp. 637-655.

Keating D.P., et al., An Experimental Evaluation of the Curvature-Strain Relation in Fault-Related Folds, 2008, AAPG Bulletin, vol. 92, No. (7), pp. 869-884.

Kerr, H., N., et al., An Automatic Method for Determining 3-D Normal Fault Geometry, 1993, Journal of Geophysical Research, vol. 98, pp. 17,837-17,857.

Klerck, P. A., The Finite Element Modelling of Discrete Fracture in Quasi-Brittle Materials., 2000, Ph.D. Thesis, University of Wales, Swansea pp. 8.45-8.65.

Klerck, P.A., et al., Discrete Fracture in Quasi-Brittle Materials Under Compressive and Tensile Stress States. 2004, Methods in Applied Mechanics and Engineering, vol. 193, pp. 3035-3056.

Ladeira, F.L., et al., Relationship Between Fracture Spacing and Bed Thickness, 1981, Journal of Structural Geology, vol. 3, pp. 179-183.

Leroy, Y.M. et al., A Plasticity Model for Discontinua. In: Lehner, F.K. and Urai, J.L., Editors, 2000, Aspect of Tectonic Faulting, Springer-Verlag, Berlin, pp. 77-108.

Lian, Z., et al., A New Method of Numerical Simulation for Perforation Completion of Fracture Formation, 2000, SPE Asia Pacific Oil and Gas Conference and Exhibition, Oct. 16-18, 2000, Society of Petroleum Engineers Inc., 6 pp.

Lisle, R. J., Detection of Zones of Abnormal Strains in Structures Using Gaussian Curvature Analysis, 1994, AAPG Bulletin, vol. 78, pp. 1811-1819.

Maerten, L., et al., Chronologic Modeling of Faulted and Fractured Reservoirs Using Geomechanically Based Restoration: Technique and Industry Applications, 2006, American Association of Petroleum Geologist Bulletin, vol. 90, pp. 1201-1226.

Matthai, S.K., et al., Finite Element-Node-Centered-Finite-Volume Two-Phase-Flow Experiments With Fractured Rock Represented by Unstructured Hybrid-Element Meshes, 2007, Journal SPE Reservoir Evaluation & Engineering, vol. 10, No. 6, pp. 740-756.

Munjiza, A., et al., A Combined Finite-Discrete Element Method in Transient Dynamics of Fracturing Solids, 1995, Engineering Computations, vol. 12, pp. 145-174.

Munjiza A., The Combined Finite Discrete Element Method, 2004, John Wiley & Sons, Chichester, England, pp. 231-289.

Narr, W., Fracture Density in the Deep Subsurface: Techniques With Applications to Point Arguello Oil Field, 1991, AAPG Bulletin, vol. 75, pp. 1300-1323.

Pearce, M. A., et al., Numerical Analysis of Fold Curvature Using Data Acquired by High-Precision GPS, 2006, Journal of Structural Geology, vol. 28, pp. 1640-1646.

Reches, Z., Tensile Fracturing of Stiff Rock Layers Under Triaxial Compressive Stress States, 1998, Int J Rock Mech Min Sci, vol. 35, pp. 456-457.

Roberts, A., Curvature Attributes and Their Application to 3D Interpreted Horizons, 2001, First Break, vol. 19, No. 2, pp. 85-100.

Rouby, D., et al., Least-Squares Palinspastic Restoration of Region of Normal Faulting—Application to the Campos Basin (Brasil), 1993, Tectonophysics, vol. 221, pp. 439-452.

Rouby, D., et al., 3-D Restoration of Complexly Folded and Faulted Surfaces Using Multiple Unfolding Mechanisms, 2000, AAPG Bulletin, vol. 84, pp. 805-829.

Sanders, C., et al., Kinematic Structural Restorations and Discrete Fracture Modeling of a Thrust Trap: A Case Study From the Tarija Basin, Argentina, 2004, Marine and Petroleum Geology, vol. 21, No. 8, pp. 845-855.

Sanderson, D.J., et al., Stress-Controlled Localization of Deformation and Fluid Flow in Fractured Rocks (in the initiation, propagation, and arrest of joints and other fractures), 2004, Geological Society Special Publications, vol. 231, pp. 299-314.

Schlangen, E..., et al., Fracture Simulations of Concrete Using Lattice Models, 1997, Computational Aspects, Engineering Fracture Mechanics vol. 57, No. (2-3), pp. 319-332.

Schlische, R. W., et al., 1996, Geometry and Scaling Relations of a Population of Very Small Rift-Related Normal Faults, 1996, Geology, vol. 24, pp. 683-686.

Schultz-Ela, D. D., et al., Predicting Fracture Permeability From Bed Curvature, in J. R. Tillerson and W. R. Wawersik, Eds., Rock Mechanics; Proceedings of the 33rd U.S. Symposium, 1992, Proceedings of the Symposium on Rock Mechanics, vol. 33, pp. 579-589.

Sellers, E.J. et al., Modeling of the Effect of Discontinuities on the Extent of the Fracture Zone Surrounding Deep Tunnels, 2000, Tunneling and Underground Space Technology, vol. 15, pp. 463-469.

Silliphant, L. J., et al., The State of Stress in the Limb of the Split Mountain Anticline, Utah, 2002, Constraints placed by transected joints, 2002, Journal of Structural Geology, v. 24, pp. 155-172.

Stead, D., et al. 2004. Modelling of Complex Rock Slope Failure Mechanisms Using a Hybrid Finite-Discrete Element Code, Proceedings of the $9^{th}$ International Symposium On Landslides, Rio de Janeiro, pp. 1067-1072.

Stead, D., et al.,. Numerical Modelling of Rock Slopes Using a Total Slope Failure Approach. In Landslides From Massive Rock Slope Failure, 2006, S.G. Evans et al. (eds), pp. 129-138.

Timm, D.H., et al., Prediction of Thermal Cracking, 2003, International Journal of Solids and Structures vol. 40, pp. 125-142.

Touboul, E., et al., Variational Methods in the Simulation of Three-Dimensional Fracture Propagation, 1986, Proceedings—Symposium on Rock Mechanics, pp. 659-668.

Van Mier J.G.M., Fracture Processes of Concrete—Assessment of Material Parameters for Fracture Models, 1997, CRC Press, Boca Raton, Florida, USA, pp. 357-366.

Walsh, J. J., et al., Geometric and Kinematic Coherence and Scale Effects in Normal Fault Systems, in A. M. Roberts, G. Yielding, and B. Freeman, Eds., The Geometry of Normal Faults, 1991, Geological Society (London) Special Publication 56, pp. 193-203.

Wei, R., Zhang, et al., Blast Simulation in Underground Mines Using the Combined Finite-Discrete Element Method. In Proceedings of the 7th WSEAS International Conference on Simulation, Modelling and Optimization (Beijing, China, Sep. 15-17, 2007). D. Xu, Ed. World Scientific and Engineering Academy and Society (WSEAS), Stevens Point, Wisconsin, pp. 257-262.

White, N. J., et al., The Relationship Between the Geometry of Normal Faults and That of Sedimentary Layers in Their Hanging Walls, 1986, Journal of Structural Geology, vol. 8, pp. 897-909.

Williams, G. D., et al., The Geometry of Listric Normal Faults and Deformation in Their Hanging Walls, 1987, Journal of Structural Geology, vol. 9, pp. 789-795.

Williams, G. D., et al., Restoration and Balance of Complex Folded and Faulted Rock Volumes: Flexural Flattening, Jigsaw Fitting and Decompaction in Three Dimensions, 1997, Tectonophysics, vol. 273, pp. 203-218.

Zorbak, et al. Well Bore Breakouts and In Situ Stress, 1985, J. Geophys., vol. 90, pp. 5523-5530.

ELFEN Explicit User Manual 2009 Version 4.4., Chapter 2 pp. 2.279-2.280, Rockfield Software Limited.

* cited by examiner

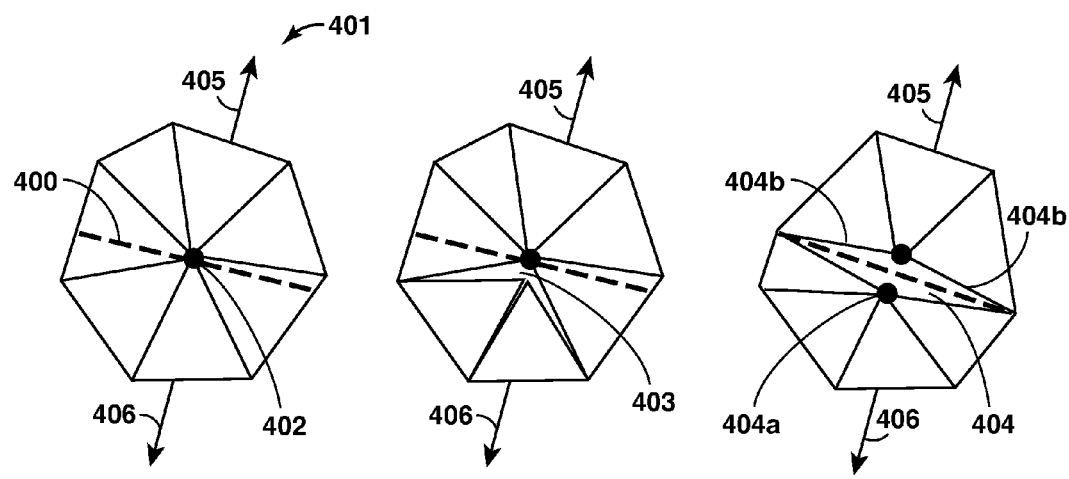
*FIG. 4A*  *FIG. 4B*  *FIG. 4C*
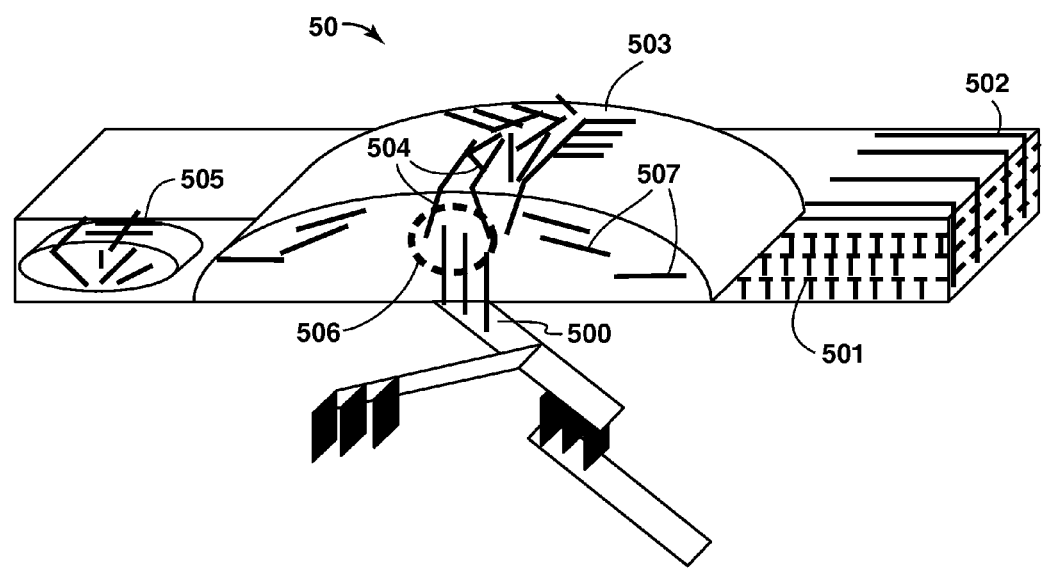
*FIG. 5*

METHOD OF PREDICTING NATURAL FRACTURES AND DAMAGE IN A SUBSURFACE REGION

CROSS-REFERENCE TO RELATED APPLICATION

This application claims the benefit of U.S. Provisional Patent Application 61/245,730, filed 25 Sep. 2009, which is hereby incorporated in its entirety by reference.

FIELD OF INVENTION

Disclosed aspects and methodologies relate to methods of fracture prediction and modeling in subsurface regions, and more particularly, to predicting and modeling natural fractures and damage localization in rock and at different scales.

BACKGROUND OF INVENTION

This section is intended to introduce various aspects of the art, which may be associated with aspects of the disclosed techniques and methodologies. A list of references is provided at the end of this section and may be referred to hereinafter. This discussion, including the references, is believed to assist in providing a framework to facilitate a better understanding of particular aspects of the disclosure. Accordingly, this section should be read in this light and not necessarily as admissions of prior art.

Extensional strain in the brittle crust of the earth is usually accommodated by opening mode natural fractures, known as joints that grow perpendicular to the most tensile principal stress. Joints can form under a combination of macromechanically driven loading conditions, such as elevated pore pressures, folding of geological strata, vertical stacking of heterogeneous layers, slip along preexisting faults, and others. Although the existence of microflaws may play a role in fracture initiation and propagation, mechanically driven factors dominate the resulting natural fracture patterns. Natural fractures occur in varying orientations, occur in clusters, have different propagating lengths and have various apertures. One of the main tasks of fracture prediction is to be able to characterize such properties.

Because joints may affect the movement, storage and recovery of hydrocarbons, a substantial effort has been focused on predicting the characteristics of subsurface systems. The most commonly sought characteristics include the intensity, aperture and orientation of the dominant set of joints. In data rich fields, fracture characterization efforts include analyzing the image log and core data, and sometimes investigating seismic attributes such as the azimuthal variation of P-wave velocities or amplitude vs offset (Keating and Fischer (2008)). However, in fields where subsurface data are limited, or in the early stages of exploration, fracture characteristics are usually predicted from 2D or 3D restoration or curvature analyses which have limited power for fracture prediction.

From a computational point of view, historically pure continuum models have been favored over discontinuum models for modeling naturally occurring fractures. This is due to their computational efficiency and ease of implementation. However, continuum models are unable to realize true material separation, ultimately exhibiting regions of zero strength and effectively eliminating meaningful post failure interaction, which may include predicting multiple sets of fractures. Indeed, all fracture in quasi-brittle materials is associated with extension and parting of material planes. In this sense, the principal problem with continuum models is that the resultant models are "too stiff" when no a priori knowledge of crack initiation or distribution is available. To develop computational methodologies with truly predictive capabilities, emphasis must be placed on the evolution of material response throughout the deformation process.

Currently such evolving material response is homogenized and is represented using phenomenological models. Given that discontinuities in rocks manifest with deformation and perturb the stress field (i.e. by introducing stress concentrations and additional kinematic freedom), accurate representation of their influence within computational models can be achieved only when the continuum models evolve naturally into a discontinuum model.

Although modeling fractures in rock masses may be of practical importance, this problem is among the most difficult to solve because fracture state evolves continuously and is not known a priori. At any time during the deformation process, fractures may be open, partly or completely closed and, if open, may close under compression. Furthermore, parts of closed fractures may begin to slip and later stick and initiate additional discrete fracture sets such as splaying or wing fractures. Thus, any numerical approach that aims to predict fracture characteristics (such as length, aperture and intensity) should be able to capture the sequential evolution of discontinuities within a model, preferably starting from a continuum state without a prior knowledge of the microflaw distribution. What is needed is a novel methodology that predicts naturally occurring fractures and damage in subsurface regions.

Broadly speaking, six different techniques have been used to predict occurrence of natural fractures and associated damage in a subsurface region: analytical methods, curvature analysis, restoration analysis, stochastic techniques, continuum mechanical models and other mechanical methods. Each of these techniques will now be discussed.

Analytical Methods: The use of analytical methods based on linear elastic fracture mechanics for fracture prediction (due to single or multiple preexisting fractures) (Horii and Nemat-Nasser (1986)) is difficult and arduous (Schlangen and Garboczi (1997)). The analytical models simplify geological processes such as boundary & loading conditions, material heterogeneity, geometry, interface friction, and post fracture interaction. Thus in most cases the analytical models overlook important factors that control primary fracture characteristics such as spacing and length (Ladeira and Price (1981); Ji et. al. (1998a); Ji et al (1998b); Timm et al. 2003)). For example, none of the aforementioned analytical techniques can take into account post fracture interaction, sequential fracturing, advanced constitutive models, material failure and complex layering. Furthermore, most of these solutions are derived under absolute tension which is rarely the case in nature. The most promising application of analytical solutions to natural fracture prediction comes from Eidelman et al. (1992) and Reches (1998) who analyzed the stress state and fracturing within stiff elliptical inclusions and brittle flat lying layers embedded in more compliant matrix (such as shale or poorly consolidated conglomerates) using Eshelby's analytical solution (Eshelby (1957)). The conclusion was that tensile fracturing might occur due to stress amplification associated with the stiffness contrast between the weak matrix and stiff inclusion(s)/layer(s). However, this approach also suffers from the limitations of the aforementioned analytical solutions: it has limited predictive power for identifying natural fracture characteristics such as intensity, spacing and connectivity and damage localization.

Curvature Analysis: In curvature analysis, it is assumed that layers of rocks deform like elastic plates. A mechanical analysis of such bending plates suggests that layer-parallel strains are directly related to the curvature of the folded surface (Fischer and Wilkerson, 2000). As summarized in Keating and Fischer (2008), a variety of methods of curvature analysis for fracture prediction have been proposed and tested (Schultz-Ela et al. (1992); Ericsson et al. (1998); Roberts (2001); Bergbauer and Pollard (2003); Bergbauer and Pollard (2004); Pearce et al. (2006)). Such tests typically compare curvature-based predictions of fracture intensity or orientation with core data, image logs, or production data from well-developed fields (Keating and Fischer (2008). The results of these tests are inconsistent. In some cases curvature analysis seems to agree with field observations (Lisle (1994); Ericsson et al. (1998)), however in other cases they yield completely opposite results (Silliphant et al. (2002); Allwardt et al. (2007)). The major limitations of curvature analysis can be listed as follows:

1. Folding/bending is not the only mechanism that may cause fracturing;
2. Continued extension might be accommodated by the reactivation of existing fractures (either shear or opening) instead of forming new fractures (Nan (1991); Bergbauer and Pollard (2004));
3. Curvature is not always a direct measure for strain or fracture intensity (Keating and Fischer. (2008));
4. Curvature analysis on the present day geometry does not consider geological history and might significantly underestimate the total deformation throughout geological time (Sanders et al. (2004)).

Therefore, unless additional kinematic and mechanical constraints are introduced, curvature based fracture predictions remain problematic.

Restoration Analysis: Restoration analysis methods for natural fracture prediction fall into two major categories:

1. Geometric and kinematic
2. Mechanical

Geometric and kinematic analysis cover most commonly used restoration techniques that aim at reproducing natural deformation patterns including faults and fractures. This analysis assumes areas that accommodate large strains might be associated with faulting and fracturing. Maerten and Maerten (2006) provide an extended review of these techniques that include: balancing cross sections by flexural slip (Dahlstrom (1969)); vertical or inclined shear techniques (Williams and Van (1987); White et al. (1986); Dula (1991)); geometric unfolding methods for 3D surfaces (Gratier et al. (1991); (Kerr et al. (1993); Williams et al. (1997)); map view restoration using rigid translation and rotation of fault blocks (Rouby et al. (1993)).

The restoration techniques mentioned above are inadequate due to the following reasons: it is uncertain which geometric restoration algorithm should be used to model rock deformation (Hauge and Gray (1996); Bulnes and McClay (1999); Maerten and Maerten (2006)); they are not based on the fundamental principles of the conservation of mass; no rock mechanical properties are incorporated in the models; mechanical interaction among faults and fractures is not considered; and only strain rather than stress is calculated as a proxy for fracture predictions. (Hennings et al. (2000); Rouby et al. (2000); Sanders et al. (2004)).

Maerten and Maerten (2006) showed that adding geomechanics to restoration techniques leads to more realistic predictions of fracture patterns: mechanical restorations incorporate fundamental physical laws that govern fracture initiation and propagation. Although mechanical restorations provide a significant uplift compared to geometric and kinematic restorations, fracture predictions are usually diffuse because they use a continuum approach with no failure. As a summary the major pitfalls of mechanical restoration analysis can be listed as follows: fracture predictions are limited to continuum-elastic analyses (i.e. no tensile failure criterion is implemented) thus leading to unrealistic stress concentrations and diffuse deformations and the analyses are only applicable to folded and faulted regions.

Stochastic Techniques: Stochastic techniques, as summarized in Walsh and Watterson (1991); Schlische et al. (1996)) and Maerten and Maerten (2006), are based on the fracture power-law size distributions and usually calibrated using available field data Although the size distributions are predictable, these techniques pay little or no consideration to physical concepts that govern fault and fracture development. Consequently they cannot take advantage of the constraints imposed by physical laws to predict the orientations and the location of these geological features (Maerten and Maerten (2006)). This becomes especially problematic when fractures are populated using statistical rules that are based on limited or poor field data. Thus mechanical considerations for joint termination, length, saturation limits and others are simply ignored. Predictions solely depend on a combination of experience, available in-situ fracture data and statistical assumptions, hence limiting the predictive capabilities of this approach significantly.

Continuum Mechanical Analysis: In classical finite element modeling (FEM), emphasis is given to the continuum response of the subsurface region. That is, in a problem domain, the materials cannot fracture (i.e. open) or be broken into pieces. Therefore fragmentation and rigid body motion is ignored. In this sense a continuous system reflects mainly the "material deformation" rather than movement, kinematics, fracture opening and interaction. A number of large scale (i.e. 2D and 3D) attempts to use a continuum damage approach have been made for predicting naturally occurring faults and fractures. These include Leroy and Sassi (2000), Beekman et al. (2000), Guiton et al. (2003a-b), and Alvarez-Gomez et al. (2008). These models stay qualitative because of the limitations of large scale models and continuum approximation of fracture occurrence. In these simulations failure is associated with plastic deformation. In other words, localized plastic strain indicates brittle faulting and less intense or more diffuse distribution of the plastic deformation would be a proxy for fractures. This approach is not entirely correct for Mode-I brittle failure where fractures initiate predominantly under tension rather than shear. To summarize the major limitations of current continuum modeling attempts for natural fracture prediction: (a) continuum models do not allow modeling of individual fractures; (b) continuum models are better suited for predicting shear localization or activation of preexisting discontinuities rather than initiation of Mode-I, opening type deformation; (c) the possibility of post failure fracture interaction and coalescence is ignored, thus prediction of multiple sets is difficult or rather erroneous; and (d) all natural fracturing in quasi-brittle rock is associated with extensional deformation and parting of material planes. Previous attempts in this area suggest damage and fracturing initiate in opening Mode-I and then coalesce to form slip surfaces or so-called shear fractures.

Mechanical Methods: There are other mechanical methods such as Distinct Element Method, XFEM (extended finite element), DDM (Displacement Discontinuity Method), and spring lattice networks, with potential applications to natural fracture prediction. The current limitation of Distinct Element based codes for natural fracture simulations is related to the high number of particles necessary for discretization even for small-scale problems. Another limitation is that particle interaction and fracture propagation—and thus the overall deformation—is controlled by spring stiffness. In other words, fracture propagation is assigned to the boundaries of the particles that are initially in contact. When the bonds between contacting particles react to the applied stress or strains and break, or if the stress state dictates that they should, fractures initiate and propagate. However, spring constants cannot be extracted directly from conventional lab tests: they are scale dependent and remain artificial parameters without extensive calibration against experimental observations.

The DDM requires the discretization of only the preexisting discontinuities (Crouch and Starfield (1983)), thus reducing the computational time significantly. DDM is most suitable for fracture propagation simulations due to slip or openings along preexisting fractures, and thus a priori knowledge of large scale faults or microscale flaws is required. This limits the applicability of this tool for naturally occurring fractures where a number of different geologically plausible scenarios exist. In most DDM based simulations, natural fractures propagate from the tips of preexisting discontinuities once a critical stress intensity is reached, putting the emphasis on microscale damage. This creates another challenge for analyzing fracturing process using DDM: what happens in the fracture tips in rocks still remains to be adequately understood. Therefore, simulations should not depend solely on micromechanics of the failure.

There are no known current applications of large-scale or small-scale XFEM for natural fracture prediction. Known XFEM methods can incorporate cohesive element technology and a variety of fracture initiation and propagation criteria. However, most applications of XFEM focus on dynamic or hydraulic fracture propagation with specific focus on microscale initiation mechanisms such as crack tip process zone and crack tip plasticity. Thus applications are limited to simulation of a single or few large fractures.

The combination of statistical theory with numerical models such as the lattice model (Van Mier (1997)) are found to be appropriate for modeling brittle rock behavior. However, at present lattice models do not seem well suited for modeling compressive rock failure. U.S. Pat. No. 6,370,491 and U.S. Pat. No. 7,043,310, both having inventors Malthe-Sorenssen et al., describe such a lattice network model that incorporates beam or spring elements. In lattice networks material properties assigned to beam elements include elastic coefficients and a breaking strength. Spring elements are modeled with artificial spring constants and a breaking length. In general this application suffers from the same pitfalls of earlier lattice models. The model as described in these two patents has several limitations. First, the lattice model does not incorporate advanced constitutive models and plastic deformation. Second, the model simulates fractures due to opening along a predefined plane of weaknesses under local tension. However, this is rarely the case in nature where in most cases rock is subjected to overall compression. The issues of (i) fracture propagation under overall compression, (ii) fracture propagation under biaxial tension and compression, and (iii) mechanically driven natural fracture formation due to elevated pore pressures, vertical stacking of heterolithic rocks, folding, and/or slip along preexisting faults, are not addressed explicitly. Third, the model does not incorporate discrete layering and contact along newly created fracture surfaces. That is, contact normal and shear stresses are not taken into account along layer interfaces or newly created discontinuities. In other words, fractures remain open as broken bonds remain repulsive. This is an oversimplification of natural processes. Indeed, natural fractures might close under compression and establish contact. Once a critical shear stress is reached, slip occurs and new sets of fractures are created in the form of wing cracks. Without well-established contact and friction algorithms, applications are strictly limited to extensional settings. Fourth, the model incorporates only breaking strength or length. However, quasi-brittle materials are better characterized by the transition between the strength based failure criteria and energy based criteria of LEFM (i.e. linear elastic fracture mechanics). Natural fracture prediction requires a combination of strength and energy release rate that defines the post peak behavior. Fifth, large scale faults are pre-defined in a spring lattice model. In nature, however, faulting and fracturing occur simultaneously. That is, small scale fractures coalesce and form large scale faults. Likewise, fault propagation might also promote fractures in the vicinity of fault tips. A method with predictive capabilities therefore should minimize human interaction and let the stress state dictate fracturing, faulting and the feedback they provide for each other. Sixth, the method does not address post fracture interaction and fracture saturation. Also, it is not stated explicitly whether fracture characteristics such as aperture, length, intensity, and spacing could be obtained routinely from the simulations. Lastly, elastic constants used in the spring lattice models are not based on experimental results and remain artificial parameters.

Existing methods are not suitable for predicting fracture occurrence under general loading and boundary conditions. There is a need for an invention that is able to predict natural fracturing and damage on a variety of scales/scenarios in a subsurface region. Such an invention should preferably take into account more realistic elastic and plastic rock properties, mechanical layering, contact detection algorithms and friction, fracture mechanics parameters such as energy release rates and/or critical stress intensity, complex boundary conditions and model geometry, and integrate preexisting fracture prediction tools. There is a need for a robust approach that would simulate fracturing and damage due to a variety of geologically plausible conditions and loading regimes, both in extension and compression. Such a solution should benefit from the advantages of current natural fracture prediction tools and integrate them in a single/simple workflow. Also, the solution should be applicable to cases where limited or no a priori preconditioning is available, for example preexisting discontinuities and/or micro-flaws, therefore minimizing human interaction. Furthermore, fracture characteristics such as length, spacing, aperture, connectivity and intensity should be obtained routinely from the numerical analysis.

A recently new technique FEM-DEM can simulate transition of rock from a state of continuum to discontinuum. An extended review of FEM-DEM and computational aspects can be found in Munjiza (2004). FEM-DEM has been primarily applied in defense industry, civil and mining engineering where excessive fragmentation occurs and large material regions fail simultaneously. Due to the nature of unstable propagation and simultaneous failure in these settings, discrete fracture characteristics such as spacing and intensity can no longer be extracted from such models. In contrast, natural fractures (i.e. under overall compression under gravity and tectonic loading conditions) may propagate very slowly and stably. In this sense simulations based on FEM-DEM can be used to extract the key characteristics of natural fractures.

Various applications of FEM-DEM include fractures due to blasting (Wei et al. (2007)) and fractures due to underground excavations and experimental rock mechanics problems (Klerck (2000); Sellers and Klerck (2000); and Klerck et al (2004)). Other engineering applications cover wellbore breakout (Crook et al. (2003)) and rock slope instability (Stead and Coggan (2006)), Eberhardt et al. (2004)).

REFERENCES

The following is a list of references:
U.S. Pat. No. 6,370,491, Malthe-Sorenssen
U.S. Pat. No. 7,043,310, Malthe-Sorenssen
Allwardt P. F., Bellahsen N., and Pollard D. D. 2007, Curvature and fracturing based on Global Positioning System data collected at Sheep Mountain Anticline, Wyo. (in Unlocking 3D earth systems; harnessing new digital technologies to revolutionize multi-scale geological models, Geosphere v. 3, no. 6, p. 408-421
Alvarez-Gomez, J. A., P. T. Meijer, J. J. Martínez-Díaz, and R. Capote (2008), Constraints from finite element modeling on the active tectonics of northern Central America and the Middle America Trench, Tectonics, v. 27, TC1008, doi: 10.1029/2007TC002162.
Beekman, F., M. Badsi and J.-D. Van Wees, (2000) Faulting, fracturing and in-situ stress prediction in hydrocarbon reservoirs: a finite element approach, Tectonophysics 320, pp. 311-329.
Bergbauer, S., and D. D. Pollard, 2003a, How to calculate normal curvatures of sampled geological surfaces: Journal of Structural Geology, v. 25, no. 2, p. 277-289.
Bergbauer, S., and D. D. Pollard, 2004, A new conceptual fold-fracture model including prefolding joints, based on field data from the Emigrant Gap anticline, Wyo.: Geological Society of America Bulletin, v. 116, no. 3-4, p. 294-307.
Bulnes, M., and K. McClay, 1999, Benefits and limitations of different 2D algorithms used in cross-section restoration of inverted extensional faults: Application to physical experiments: Tectonophysics, v. 312, p. 175-189.
Cottrell M. G., Yu J., Wei Z. J., Owen D. R. J. 2003. Numerical modeling of ceramics subject to impact using adaptive numerical discrete element techniques. Engineering Computations v. 20, (1), p. 82-106
Crook, T., Wilson, S., Yu, J. G. and Owen, R. 2003. Computational modeling of the localized deformation associated with borehole breakout in quasi-brittle materials. Journal of Petroleum Science and Engineering, v. 38, p. 177-186.
Crouch, S. L. and Starfield A. M., 1983. Boundary Element Methods in Solid Mechanics: with Applications in Rock Mechanics and Geological Engineering. George Allen & Unwin, London, p. 79-109
Dahlstrom, C. D. A., 1969, Balanced cross section: Canadian Journal of Earth Sciences, v. 6, p. 743-757.
Dula, W. F., 1991, Geometric models of listric normal faults and rollover folds: AAPG Bulletin, v. 75, p. 1609-1625.
E. Eberhardt, D. Stead, J. S. Coggan, 2004, Numerical analysis of initiation and progressive failure in natural rock slopes—the 1991 Randa rockslide, International Journal of Rock Mechanics and Mining Sciences, Volume 41, Issue 1, p. 69-87
Eidelman, A., and Reches, Z., 1992, Fractured pebbles—A new stress indicator, Geology, 20, 301-304.
ELFEN Explicit User Manual 2009 Version 4.4., Chapter 2 p. 2.279-2.280, Rockfield Software Limited.
Ericsson, J. B., H. C. McKean, and R. J. Hooper, 1998, Facies and curvature controlled 3D fracture models in a Cretaceous carbonate reservoir, in G. Jones, Q. J. Fisher, and R. J. Knipe, eds., Faulting, fault sealing and fluid flow in hydrocarbon reservoirs: Geological Society Special Publication 147, p. 299-312.
Eshelby J. D. 1957, The determination of the elastic field of an ellipsoidal inclusion and related problems. Proceedings of the Royal Society, v. A241, P. 376-396.
Fischer, M. P., and M. S. Wilkerson, 2000, Predicting the orientation of joints from fold shape: Results of pseudo three-dimensional modeling and curvature analysis: Geology, v. 28, no. 1, p. 15-18.
Gratier, J.-P., B. Guillier, A. Delorme, and F. Odonne, 1991, Restoration and balance of a folded and faulted surface by best fitting of finite elements: Principle and applications: Journal of Structural Geology, v. 13, p. 111-115.
Guiton, M. L. E., Y. M. Leroy, and W. Sassi, 2003a, Activation of diffuse discontinuities and folding of sedimentary layers: Journal of Geophysical Research, v. 108, B4, p. 2183-2203.
Guiton, M. L. E., W. Sassi, Y. M. Leroy, and B. D. M. Gauthier, 2003b, Mechanical constraints on the chronology of fracture activation in folded Devonian sandstone of the western Moroccan Anti-Atlas: Journal of Structural Geology, v. 25, p. 1317-1330.
Hauge, T. A., and G. G. Gray, 1996, A critique of techniques for modeling normal-fault and rollover geometries, in P. G. Buchanan and D. A. Nieuwland, eds., Modern developments in structural interpretation, validation and modelling: Geological Society (London) Special Publication, v. 99, p. 89-97.
Hennings, P. H., J. E. Olson, and L. B. Thompson, 2000, Combining outcrop data and three-dimensional structural models to characterize fractured reservoirs: An example from Wyoming: AAPG Bulletin, v. 84, p. 830-849.
Horii H. and Nemat-Nasser S., 1986, Brittle failure in compression: Splitting, faulting and brittle-ductile transition Philosophical Transactions for the Royal Society of London. Series A, Mathematical and Physical Sciences, Volume 319, Issue 1549, pp. 337-374
Ji, S., Saruwatari, K., 1998a. A revised model for the relationship between joint spacing and layer thickness. Journal of Structural Geology v. 20, p. 1495-1508.
Ji, S., Zhu, Z., Wang, Z., 1998b. Relationship between joint spacing and bed thickness in sedimentary rocks: effects of interbed slip. Geology Magazine v. 135, p. 637-655.
Keating D. P., and Fischer, M. P., 2008, An experimental evaluation of the curvature-strain relation in fault-related folds, AAPG Bulletin v. 92, no. (7), p. 869-884.
Kerr, H., N. White, and J.-P. Brun, 1993, An automatic method for determining 3-D normal fault geometry: Journal of Geophysical Research, v. 98, p. 17,837-17,857.
Klerck, P. A. 2000. The finite element modelling of discrete fracture in quasi-brittle Materials. Ph.D. thesis, University of Wales, Swansea pages 8.45-8.65.
Klerck, P. A., Sellers, E. J. and Owen, D. R. J. 2004. Discrete fracture in quasi-brittle materials under compressive and tensile stress states. Methods in Applied Mechanics and Engineering, v.193, p. 3035-3056.
Ladeira, F. L., Price, N. J., 1981. Relationship between fracture spacing and bed thickness. Journal of Structural Geology v. 3, p. 179-183.
Leroy, Y. M. and Sassi, W., 2000. A plasticity model for discontinua. In: Lehner, F. K. and Urai, J. L., Editors. Aspect of Tectonic Faulting, Springer-Verlag, Berlin, pp. 77-108.
Lisle, R. J., 1994, Detection of zones of abnormal strains in structures using Gaussian curvature analysis: AAPG Bulletin, v. 78, p. 1811-1819.
Maerten, L., Maerten, F., 2006, Chronologic modeling of faulted and fractured reservoirs using geomechanically based restoration: Technique and industry applications: American Association of Petroleum Geologist Bulletin, v. 90, p. 1201-1226.

Munjiza A. 2004, The Combined Finite Discrete Element Method. John Wiley & Sons, Chichester, England, p. 231-289.

Narr, W., 1991, Fracture density in the deep subsurface: Techniques with applications to Point Arguello oil field: AAPG Bulletin, v. 75, p. 1300-1323.

Pearce, M. A., R. R. Jones, S. A. F. Smith, K. J. W. McCaffrey, and P. Clegg, 2006, Numerical analysis of fold curvature using data acquired by high-precision GPS: Journal of Structural Geology, v. 28, p. 1640-1646.

Reches, Z. 1998. Tensile fracturing of stiff rock layers under triaxial compressive stress states, *Int J Rock Mech Min Sci* 35, pp. 456-457.

Roberts, A., 2001, Curvature attributes and their application to 3D interpreted horizons: First Break, v. 19, no. 2, p. 85-100.

Rouby, D., P. R. Cobbold, P. Szatmari, S. Demerican, D. Coelho, and J. A. Rici, 1993, Least-squares palinspastic restoration of region of normal faulting—Application to the Campos Basin (Brasil): Tectonophysics, v. 221, p. 439-452.

Rouby, D., H. Xiao, and J. Suppe, 2000, 3-D restoration of complexly folded and faulted surfaces using multiple unfolding mechanisms: AAPG Bulletin, v. 84, p. 805-829.

Sanders, C., M. Bonora, D. Richards, E. Kozlowski, C. Sylwan, and M. Cohen, 2004, Kinematic structural restorations and discrete fracture modeling of a thrust trap: A case study from the Tarija Basin, Argentina: Marine and Petroleum Geology, v. 21, no. 8, p. 845-855.

Schlangen, E. & Garboczi, E. J. 1997. Fracture simulations of concrete using lattice models: Computational aspects. Engineering Fracture Mechanics v. 57, no. (2-3), p. 319-332.

Schlische, R. W., S. S. Young, R. V. Ackermann, and A. Gupta, 1996, Geometry and scaling relations of a population of very small rift-related normal faults: Geology, v. 24, p. 683-686.

Schultz-Ela, D. D., and J. Yeh, 1992, Predicting fracture permeability from bed curvature, in J. R. Tillerson and W. R. Wawersik, eds., Rock mechanics; Proceedings of the 33rd U.S. Symposium: Proceedings of the Symposium on Rock Mechanics, v. 33, p. 579-589.

Sellers, E. J. and Klerck, P. 2000. Modeling of the effect of discontinuities on the extent of the fracture zone surrounding deep tunnels. Tunneling and Underground Space Technology, v. 15, p. 463-469.

Silliphant, L. J., T. Engelder, and M. R. Gross, 2002, The state of stress in the limb of the Split Mountain anticline, Utah: Constraints placed by transected joints: Journal of Structural Geology, v. 24, p. 155-172.

Stead, D., and Coggan, J. S. 2006. Numerical Modelling of rock slopes using a total slope failure approach. In Landslides from Massive Rock Slope Failure: S. G. Evans et al. (eds) p. 129-138

Timm, D. H., Guzina, B. B., Voller, V. R., 2003. Prediction of thermal cracking International Journal of Solids and Structures v. 40, 125-142.

Van Mier J. G. M., 1997, Fracture Processes of Concrete—Assessment of Material Parameters for Fracture Models, CRC Press, Boca Raton, Fla., USA, p. 357-366.

Walsh, J. J., and J. Watterson, 1991, Geometric and kinematic coherence and scale effects in normal fault systems, in A. M. Roberts, G. Yielding, and B. Freeman, eds., The geometry of normal faults: Geological Society (London) Special Publication 56, p. 193-203.

Wei, R., Zhang, S., Karunasena, W., Sivakugan, N., and Zhang, H. 2007. Blast simulation in underground mines using the combined finite-discrete element method. In *Proceedings of the 7th WSEAS international Conference on Simulation, Modelling and Optimization* (Beijing, China, Sep. 15-17, 2007). D. Xu, Ed. World Scientific and Engineering Academy and Society (WSEAS), Stevens Point, Wis., 257-262.

White, N. J., J. A. Jackson, and D. P. McKenzie, 1986, The relationship between the geometry of normal faults and that of sedimentary layers in their hanging walls: Journal of Structural Geology, v. 8, p. 897-909.

Williams, G. D., and I. Vann, 1987, The geometry of listric normal faults and deformation in their hanging walls: Journal of Structural Geology, v. 9, p. 789-795.

Williams, G. D., S. J. Kane, T. S. Buddin, and A. J. Richards, 1997, Restoration and balance of complex folded and faulted rock volumes: Flexural flattening, jigsaw fitting and decompaction in three dimensions: Tectonophysics, v. 273, p. 203-218.

SUMMARY OF THE INVENTION

A method for predicting localized damage and naturally occurring fractures in a subsurface region is provided. This invention uses a hybrid FEM-DEM (i.e. finite-discrete element) framework combined with a fracture risking analysis and fracture initiation and propagation criteria, to model the transition of rock from a state of continuum to discontinuum. The risking analysis combines results from other natural fracture prediction tools (e.g. displacement discontinuity method, restoration analyses, curvature analysis, analytical solutions, continuum analysis) to augment FEM-DEM solutions, such as by providing remote and local boundary conditions and identifying potential regions of anticipated damage and fracturing. Natural fractures and damage information are extracted from the modeling results and may be used directly for predictions or used as input into other fracture analysis tools or techniques. The FEM-DEM and risking techniques can be incorporated into a variety of numerical simulation software packages that use a finite-discrete method solver. Fractures related to multiple mechanisms may be addressed by simulating a variety of geologically plausible scenarios starting from an initial intact stage. Existing methods, used as screening tools, may be combined where output is used to condition advanced models (e.g. FEM-DEM).

In another aspect, a method of predicting fractures in a subsurface region is provided. The subsurface region is defined. An earth model that represents the subsurface region is created. The earth model includes a mesh having a plurality of nodes and elements to represent the geology of the subsurface region. The model is pre-analyzed to identify fracture areas of the subsurface region having a potentially high risk of fracture. The pre-analyzing considers outputs from a plurality of fracture prediction tools to identify the fracture areas. Mechanical properties of rock are predefined. Fracture initiation criteria are chosen. A rate of fracture propagation is pre-defined based upon site-specific information regarding the subsurface region. A numerical model is built that represents the earth model. Boundary conditions are assigned to the numerical model. Zones are created within the numerical model that are usable in a continuum-discontinuum method. A mesh control is introduced to reduce mesh alignment and associated fracture path bias. Portions of the mesh that have been identified as fracture areas are re-meshed. A finite-discrete element solver and a nodal failure mechanism for the numerical model are integrated to discover natural fracture patterns and localized damage. A preliminary run of the numerical model is performed to predict fracture occurrence. It is determined whether predicted fracture occurrence correlates with expected natural response. Natural fracture characteristics and damage from the numerical model are outputted.

According to methodologies and techniques, pre-analyzing the numerical model may include identifying fracture areas by analyzing an equivalent form of the subsurface model where no fracturing is allowed, using at least one of a forward continuum model, elastic restoration, geometric restoration, displacement discontinuity methods, maximum curvature analysis, and analytical solutions. Discrete fracture properties may be assigned to the fracture areas. Predicting natural fractures may be performed by identifying at least one of regions of zero tensile strength, plastic or elastic strain localizations, and amplified tensile/compressive stresses. Fracture areas include at least one of regions with elevated pore pressures, regions with preexisting faults, regions with increased curvature, regions with vertical stacks of heterolithic layers of rock, regions with uplift and exhumation, regions with low mean stress, regions with tensile stress, and regions with thermally induced stresses. Areas predicted to exhibit deformation and that have high fracture risk compared to other areas of the subsurface region may be re-meshed. The re-meshing may be an initial re-meshing performed to increase the density of the mesh and to control mesh alignment in the vicinity of potential high risk fracture areas.

According to other methodologies and techniques, parameters may be adjusted relating to at least one of the subsurface region of interest, mechanical properties of rock, fracture initiation criteria, the rate of fracture propagation, and the boundary conditions when predicted fracture occurrence does not correlate with expected natural response, and additional preliminary runs of the numerical model may be performed using the adjusted parameters. The boundary conditions may be assigned such that the numerical model predicts fracture occurrence due to mechanically driven factors including at least one of folding, faulting, compression of vertically stacked layers, elevated pore pressures, regional compression, regional extension, thermal loading, uplift, and exhumation. The failure mechanism may incorporate an advanced constitutive model for intact rock that simulates fracturing under tensile, compressive or a combination of tensile-compressive regimes, and predicts formation of damage when criteria for predicting a fracture are satisfied. Tensile strength of elements may be decreased as damage increases until energy needed to form a discrete fracture is released. Fracture initiation criteria may include at least one of critical stress intensity, minimum energy density, maximum tensile strength, and critical energy release rate. Fracture growth ratio may be at least one of sub-critical, critical, super-critical, and rate independent. Defining the subsurface region may include defining a material property that is at least one of tensile strength and critical energy release rate. The boundary conditions may be at least one of stress, strain, force, displacement, and thermal loading. Mechanical and fracture properties may be distributed with a random initial heterogeneity within the fracture areas to introduce material heterogeneity therein. The material heterogeneity may be defined by specifying randomly distributed elastic properties, porosity, and tensile strength within the mesh. One or more microflaws with a random distribution of at least one of length spacing, aperture, and orientation may be introduced. Natural fracture patterns, comprising at least one of spacing, aperture, length, connectivity, and intensity, may be extracted from the numerical model after the preliminary run is performed.

In another aspect, a computer program product is provided. The computer program product includes a computer usable medium, or a machine-readable medium, that has computer readable code embodied therein. The computer readable code is adapted to be executed to implement a method for natural fracture and damage prediction in a subsurface region. The method, which is embodied in the code, includes: defining the subsurface region; creating an earth model that represents the subsurface region of interest, the earth model including a mesh having a plurality of nodes and elements to represent the geology of the subsurface region of interest; pre-analyzing the model to identify fracture areas of the subsurface region having a potentially high risk of fracture, wherein the pre-analyzing considers outputs from a plurality of fracture prediction tools to identify the fracture areas; pre-defining mechanical properties of rock and choosing fracture initiation criteria; pre-defining a rate of fracture propagation based upon site-specific information regarding the subsurface region; building a numerical model that represents the earth model; assigning boundary conditions to the numerical model; creating zones within the numerical model that are usable in a continuum-discontinuum method; introducing a mesh control to reduce mesh alignment and associated fracture path bias; re-meshing portions of the mesh that have been identified as fracture areas; integrating a finite-discrete element solver and a nodal failure mechanism for the numerical model to discover natural fracture patterns and localized damage; performing a preliminary run of the numerical model to predict fracture occurrence; determining whether predicted fracture occurrence correlates with expected natural response; and outputting natural fracture characteristics and damage from the numerical model.

According to another aspect, a method of managing hydrocarbon resources is provided. According to the method, a subsurface region is defined. An earth model that represents the subsurface region is created. The earth model includes a mesh having a plurality of nodes and elements to represent the geology of the subsurface region. The model is pre-analyzed to identify fracture areas of the subsurface region having a potentially high risk of fracture. The pre-analyzing considers outputs from a plurality of fracture prediction tools to identify the fracture areas. Mechanical properties of rock are pre-defined. Fracture initiation criteria are chosen. A rate of fracture propagation is pre-defined based upon site-specific information regarding the subsurface region. A numerical model is built that represents the earth model. Boundary conditions are assigned to the numerical model. Zones are created within the numerical model that are usable in a continuum-discontinuum method. A mesh control is introduced to reduce mesh alignment and associated fracture path bias. Portions of the mesh that have been identified as fracture areas are re-meshed. A finite-discrete element solver and a nodal failure mechanism for the numerical model are integrated to discover natural fracture patterns and localized damage. A preliminary run of the numerical model is performed to predict fracture occurrence. It is determined whether predicted fracture occurrence correlates with expected natural response. Hydrocarbons are managed based on an output of predicted fracture characteristics and damage from the numerical model.

BRIEF DESCRIPTION OF THE DRAWINGS

The foregoing and other advantages of the present invention may become apparent upon reviewing the following detailed description and drawings of non-limiting examples of embodiments in which:

FIGS. 4A, 4B and 4C are simplified schematic drawings showing a crack model and element splitting;

FIG. 5 is a perspective drawing showing results of integration and identification of high risk fracture zones;

DETAILED DESCRIPTION OF THE INVENTION

Figure 1:
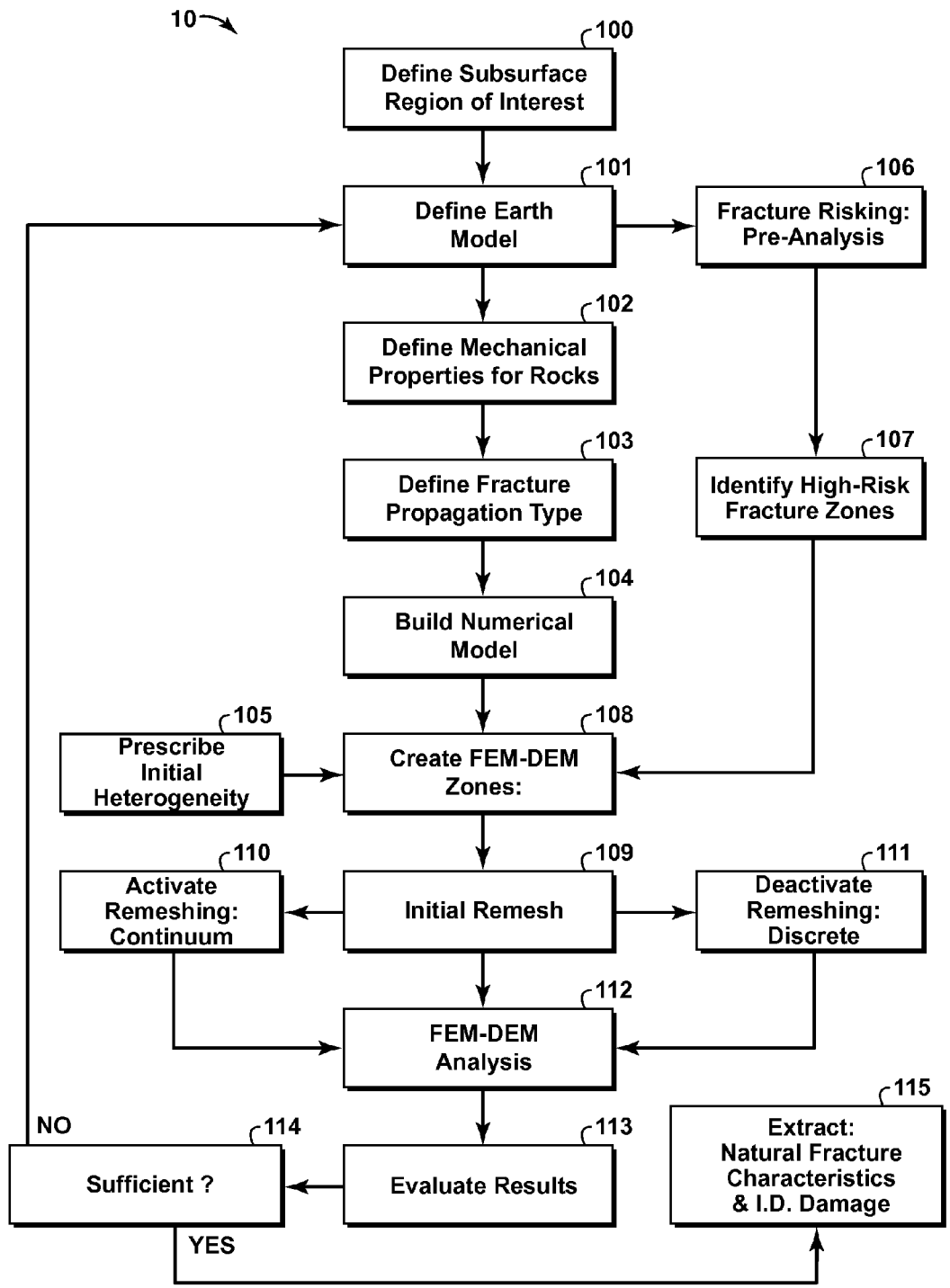
FIG. 1 is a flowchart showing a method according to disclosed aspects and methodologies.

To the extent the following description is specific to a particular embodiment or a particular use, this is intended to be illustrative only and is not to be construed as limiting the scope of the invention. On the contrary, it is intended to cover all alternatives, modifications, and equivalents that may be included within the spirit and scope of the invention.

Some portions of the detailed description which follows are presented in terms of procedures, steps, logic blocks, processing and other symbolic representations of operations on data bits within a memory in a computing system or a computing device. These descriptions and representations are the means used by those skilled in the data processing arts to most effectively convey the substance of their work to others skilled in the art. In this detailed description, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

Unless specifically stated otherwise as apparent from the following discussions, terms such as "defining", "creating", "including", "representing", "pre-analyzing", "pre-defining", "choosing", "building", "assigning", "creating", "introducing", "eliminating", "re-meshing", "integrating", "discovering", "performing", "predicting", "determining", "outputting", "identifying", "analyzing", "using", "assigning", "disturbing", "increasing", "adjusting", "incorporating", "simulating", "decreasing", "distributing", "specifying", "extracting", "displaying", "executing", "implementing", and "managing", or the like, may refer to the action and processes of a computer system, or other electronic device, that transforms data represented as physical (electronic, magnetic, or optical) quantities within some electrical device's storage into other data similarly represented as physical quantities within the storage, or in transmission or display devices. These and similar terms are to be associated with the appropriate physical quantities and are merely convenient labels applied to these quantities.

Embodiments disclosed herein also relate to an apparatus for performing the operations herein. This apparatus may be specially constructed for the required purposes, or it may comprise a general-purpose computer selectively activated or reconfigured by a computer program or code stored in the computer. Such a computer program or code may be stored or encoded in a computer readable medium or implemented over some type of transmission medium. A computer-readable medium includes any medium or mechanism for storing or transmitting information in a form readable by a machine, such as a computer ('machine' and 'computer' are used synonymously herein). As a non-limiting example, a computer-readable medium may include a computer-readable storage medium (e.g., read only memory ("ROM"), random access memory ("RAM"), magnetic disk storage media, optical storage media, flash memory devices, etc.). A transmission medium may be twisted wire pairs, coaxial cable, optical fiber, or some other suitable transmission medium, for transmitting signals such as electrical, optical, acoustical or other form of propagated signals (e.g., carrier waves, infrared signals, digital signals, etc.)).

Furthermore, modules, features, attributes, methodologies, and other aspects can be implemented as software, hardware, firmware or any combination thereof. Wherever a component of the invention is implemented as software, the component can be implemented as a standalone program, as part of a larger program, as a plurality of separate programs, as a statically or dynamically linked library, as a kernel loadable module, as a device driver, and/or in every and any other way known now or in the future to those of skill in the art of computer programming. Additionally, the invention is not limited to implementation in any specific operating system or environment.

Various terms as used herein are defined below. To the extent a term used in a claim is not defined below, it should be given the broadest possible definition persons in the pertinent art have given that term as reflected in at least one printed publication or issued patent.

As used herein, "and/or" placed between a first entity and a second entity means one of (1) the first entity, (2) the second entity, and (3) the first entity and the second entity. Multiple elements listed with "and/or" should be construed in the same fashion, i.e., "one or more" of the elements so conjoined.

As used herein, "displaying" includes a direct act that causes displaying, as well as any indirect act that facilitates displaying. Indirect acts include providing software to an end user, maintaining a website through which a user is enabled to affect a display, hyperlinking to such a website, or cooperating or partnering with an entity who performs such direct or indirect acts. Thus, a first party may operate alone or in cooperation with a third party vendor to enable the reference signal to be generated on a display device. The display device may include any device suitable for displaying the reference image, such as without limitation a CRT monitor, a LCD monitor, a plasma device, a flat panel device, or printer. The display device may include a device which has been calibrated through the use of any conventional software intended to be used in evaluating, correcting, and/or improving display results (e.g., a color monitor that has been adjusted using monitor calibration software). Rather than (or in addition to) displaying the reference image on a display device, a method, consistent with the invention, may include providing a reference image to a subject. "Providing a reference image" may include creating or distributing the reference image to the subject by physical, telephonic, or electronic delivery, providing access over a network to the reference, or creating or distributing software to the subject configured to run on the subject's workstation or computer including the reference image. In one example, the providing of the reference image could involve enabling the subject to obtain the reference image in hard copy form via a printer. For example, information, software, and/or instructions could be transmitted (e.g., electronically or physically via a data storage device or hard copy) and/or otherwise made available (e.g., via a network) in order to facilitate the subject using a printer to print a hard copy form of reference image. In such an example, the printer may be a printer which has been calibrated through the use of any conventional software intended to be used in evaluating, correcting, and/or improving printing results (e.g., a color printer that has been adjusted using color correction software).

As used herein, "exemplary" is used exclusively herein to mean "serving as an example, instance, or illustration." Any aspect described herein as "exemplary" is not necessarily to be construed as preferred or advantageous over other aspects.

As used herein, "hydrocarbon reservoirs" include reservoirs containing any hydrocarbon substance, including for example one or more than one of any of the following: oil (often referred to as petroleum), natural gas, gas condensate, tar and bitumen.

As used herein, "hydrocarbon management" or "managing hydrocarbons" includes hydrocarbon extraction, hydrocarbon production, hydrocarbon exploration, identifying potential hydrocarbon resources, identifying well locations, determining well injection and/or extraction rates, identifying reservoir connectivity, acquiring, disposing of and/or abandoning hydrocarbon resources, reviewing prior hydrocarbon management decisions, and any other hydrocarbon-related acts or activities.

As used herein, "machine-readable medium" refers to a medium that participates in directly or indirectly providing signals, instructions and/or data. A machine-readable medium may take forms, including, but not limited to, non-volatile media (e.g. ROM, disk) and volatile media (RAM). Common forms of a machine-readable medium include, but are not limited to, a floppy disk, a flexible disk, a hard disk, a magnetic tape, other magnetic medium, a CD-ROM, other optical medium, punch cards, paper tape, other physical medium with patterns of holes, a RAM, a ROM, an EPROM, a FLASH-EPROM, or other memory chip or card, a memory stick, and other media from which a computer, a processor or other electronic device can read.

As used herein, "subsurface" means beneath the top surface of any mass of land at any elevation or over a range of elevations, whether above, below or at sea level, and/or beneath the floor surface of any mass of water, whether above, below or at sea level.

As used herein, the term "fracture" refers to any local separation or a discontinuity plane in a geological formation such as a fault/shear (Mode II) fracture or joint/opening (Mode I) fracture. The term "joint or Mode-I fracture" refers to a fracture in rock where there has been no or insignificant lateral movement in the plane of the fracture (up, down or sideways) of one side relative to the other (402, 403, 404) as described further in reference to FIG. 4 as described in Klerck et al. 2004. This makes it different from a fault or shear fracture which is defined as a fracture in rock where one side slides laterally past to the other. As used herein, the term "natural fracture" refers to any fracture in subsurface that is not produced by human activities such as drilling, accidental or intentional hydro-fracturing, core handling etc. The term "natural fractures" is used to distinguish fractures that form due to geological causes, such as tectonic loading (e.g. regional compression/extension), folding, faulting, pore pressures, erosion/unloading, material heterogeneity, and/or cooling joints.

As used herein "damage" refers to a zone of intensely deformed and/or fragmented rock. This zone can accommodate intense slip, opening or fragmentation. Damage can either be localized in a relatively narrow band or it may involve large material regions that fail and fragment simultaneously.

As used herein "mode of fracture origin" refers to the mode (e.g. Mode-I or Mode-II) by which fracture initiation occurred. For example, a fracture that initiated as Mode I can later close and accommodate slip along the fracture faces as in Mode II (802). However the mode of origin remains Mode-I.

As used herein the term "region" refers to an area or volume of geologic interest, and may be associated with the geometry, attitude and arrangement of the area or volume at any scale (i.e. mm to km). A region may have characteristics such as folding, faulting, cooling, unloading, and/or fracturing that has occurred therein.

As used herein, the term "Gauss point" refers to a point within a finite element where variables such as stress or strain are calculated.

As used herein the term "heterolithic" refers to vertical stacks of rocks with different material properties.

As used herein "forward mechanical models" include FEM-DEM, DEM, and/or continuum analysis where rock layers are deformed from an initial position to a final geometry.

As used herein, "DEM" refers to Discrete Element Methods, which are numerical methods for computing the motion of large numbers of particles or elements, which represent a subsurface region herein.

As used herein, "FEM" refers to Finite Element Methods, which are numerical techniques for solving engineering problems by dividing a region into smaller elements such that the combined properties of the smaller elements contain the properties of the region.

As used herein the term "restoration analysis" refers to unfolding, unfaulting and re-ordering (i.e. translations and rotations) of deformed rocks back to an initial, primary depositional geometry.

As used herein the term "high-risk fracture zone" refers to a region of rock where natural fractures are most likely to occur.

As used herein "mechanically driven factors" refer to: folding, faulting, material heterogeneity, regional compression, presence of material contrast and inclusions, pore-pressures, slip along preexisting discontinuities, and the like.

As used herein, "continuum" refers to numerical representation of a subsurface zone in which variables such as stress vary smoothly and no explicit discontinuities are simulated.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional blocks not shown herein. While the figures illustrate various actions occurring serially, it is to be appreciated that various actions could occur in series, substantially in parallel, and/or at substantially different points in time.

In some aspects, a method is provided that predicts naturally occurring fractures and damage as observed in a subsurface region. This methodology integrates or combines a variety of fracture prediction tools and a hybrid finite-discrete element method (FEM-DEM) that simulates the transition of rock from a continuous to a discontinuous state as observed in nature by: (i) combining classic analysis such as Finite Element Method (FEM) and Discrete Element Method (DEM) with a fracture initiation criteria and (ii) integrating currently available fracture prediction tools into a single workflow. As a result an approach for predicting natural fractures and damage in the subsurface is developed. Furthermore a variety of geologically plausible scenarios that can cause opening mode natural fractures are simulated. These scenarios can include but are not limited to: vertical compression of heterolithic rocks, folding, faulting, styolites and pore pressures. The feasibility of this approach for predicting damage and naturally occurring fractures is demonstrated at different scales. In another aspect, a method is disclosed for simulating natural fracture initiation and propagation in a subsurface formation by combining FEM-DEM technology, adaptive remeshing and advanced constitutive models. In another aspect, a method is disclosed for extracting hydrocarbons from a subsurface region. In another aspect, a computer program product is provided that includes a computer usable medium having a computer readable program code embodied therein, the computer readable program code adapted to be executed to implement at least one of the methods for fracture prediction disclosed herein.

An aspect of the disclosed methodologies and techniques has four principal parts: (1) defining the subsurface region of interest; (2) running a pre-analysis and identifying high-risk fracture zones; (3) integrating the identified high-risk fracture zones into a hybrid FEM-DEM model; and (4) combining mechanically driven factors, advanced constitutive models, fracture initiation/propagation criteria and an explicit FEM-DEM solver to predict damage and natural fracture occurrence and characteristics using forward mechanical modeling. These parts of the method will now be discussed in more detail by referring to the method 10 shown in FIG. 1 according to an aspect of the disclosed techniques. Features shown in other Figures may be mentioned as non-limiting examples to assist in understanding method 10 and other methods disclosed herein. At block 100 the method 10 defines a subsurface region of interest by identifying its major structural components. The subsurface region of interest may also be defined by defining site-specific data relating to where natural fracture prediction is to be performed. The subsurface region could be defined in its final deformed geometry or in its restored/undeformed state, shown in FIG. 6A as stacks of undeformed heterolithic rocks (603, 604, 605, 606) and underlying faults (601, 602). The size of the region of interest can be at any scale. Structural components may include folds, faults, stacks of heterolithic layers, and mega and/or regional fracture sets, to name a few non-limiting examples. The site-specific data may include, but is not limited to, formation parameters obtained from logging information and well testing, as well as 2D-3D seismic profiles, core tests, and outcrop observations.

Using model parameters derived from site-specific data obtained at block 100, at block 101 the boundaries of the earth model and the initial geometry are defined, such as mechanical layering and the number of rock layers to be included. The earth model geometry can be defined in two dimensions or three dimensions. Within the earth model, a mesh made up of a plurality of interconnected nodes and finite elements that characterize the geometry of the region of interest, may be defined. The mesh pattern may be regular and triangular, although other patterns such as irregular triangles or structured rectangular mesh geometries may be used.

Figure 2:
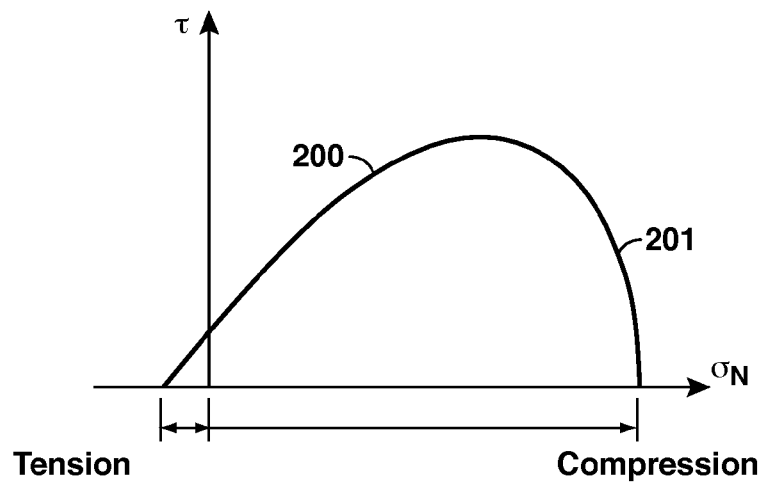
FIG. 2 is a graph showing an exemplary advanced constitutive model.

At blocks 102 and 103 model parameters for rocks are defined. These parameters may include but are not limited to mechanical properties of rocks (i.e. elastic or elasto-plastic), critical energy release rate, tensile strength, advanced constitutive laws for rock as shown in FIG. 2, global contact and friction parameters, mechanical layering, and the number of rock layers to be included in the model. The initial model geometry can be defined in two dimensions or three dimensions.

The various advanced constitutive models may include continuum and/or discontinuum behavior of a particular region. These constitutive models can account for the effect of different failure modes such as shear failure and ductile failure, and volumetric response such as compaction and dilation. These constitutive models can adapt tensile strength and critical energy release rate parameters such that material parting and breakage is simulated.

Advanced constitutive models may be used to represent the material behavior. Examples include, but are not limited to, overall compression or biaxial tension/compression, an explicit coupling between extensional inelastic strain associated with the dilation response of compressive failure, tensile strength in the dilation direction even in the absence of tensile stresses, or coupling between brittle shear failure with tensile damage. For combined compression/tension or overall compression regimes, it may be advantageous to involve more sophisticated constitutive models based on an elasto-plastic type material, for example. Alternatively, a constitutive model may be used that includes brittle shear failure 200 and compactive limiting capacity 201 (FIG. 2).

Figure 3:
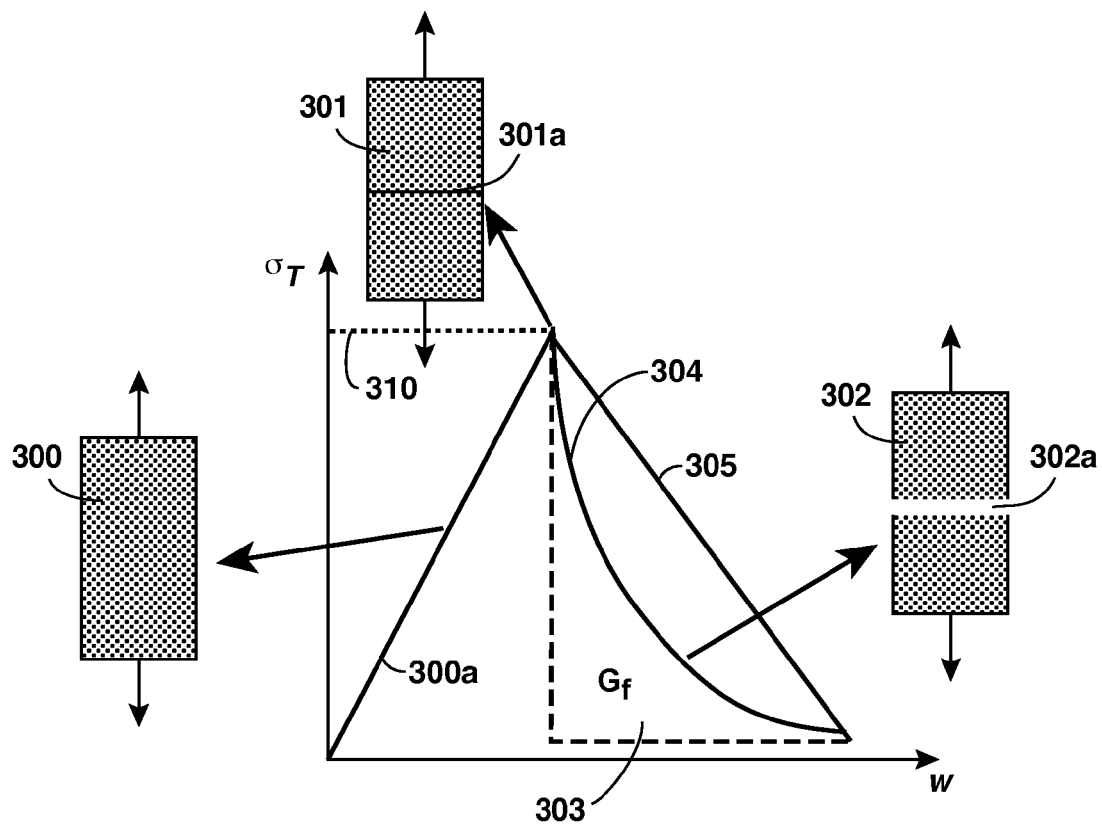
FIG. 3 is a graph showing maximum tensile strength criteria and energy release for fracture initiation.

Natural fractures propagate within the finite element mesh if coupled with a fracture initiation criteria. The method may include a criterion where fractures initiate in directions normal to the principal stress and propagate perpendicular to most tensile principal stress direction when a limiting tensile stress, tensile strain, critical stress intensity is reached or when a critical strain energy is released (or any combination of these criteria). An exemplary model is shown in FIG. 3 where potential fracture localization is realized (shown at 301a in element 301) as tensile stress increases on an element 300 (as shown by line 300a) until reaching a maximum strength 310 of the element 300 and a discrete fracture and damage 302a is realized perpendicular to the direction of most tensile principal stress as critical energy is released. The post-peak behavior of fracture can be parabolic (304) or linear (305).

As soon as a pre-defined failure criteria is satisfied, a discrete fracture can be inserted into the finite element mesh, passing through the associated nodal point and in the given direction. Fracturing can occur at a single nodal point, or a series of points can fail simultaneously during the same time increment. Realization of discrete fractures within a finite element mesh requires splitting the elements as shown in FIG. 4A at 401 (also described in Cottrell et al. (2003) and the ELFEN User Manual as referred to in the List of References). A failure initiation criterion evaluated at Gauss points of an element may be used to determine the onset of local fracture 400 within the domain, for example, as a response to a local tensile stress or strain along directions 405, 406. As shown in FIG. 4B and FIG. 4C, a topological update then can be performed whereby a discrete fracture 403, 404 is inserted into the domain as failure occurs at a critical nodal point 402 (i.e.

a nodal failure mechanism). This may require creating additional nodes 404a and connections 404b within the finite element mesh. Alternatively, fracture direction can be aligned to element boundaries attached to the node where failure occurs, as shown at 403 in FIG. 4B The contact response of the newly created surfaces can be simulated by using a variety of contact algorithms as is known in the art. Once open, discrete fractures may close under compression, re-establish the contact between fracture surfaces and either slip, stick or reopen. This might further promote initiation of second or third order fracture sets.

Block 103 of method 10 pre-defines a rate of fracture propagation. For example, once a fracture initiates in the numerical model according to the failure criterion as defined at block 102, fractures may propagate at different rates. Therefore, depending on site-specific information obtained at block 100, at block 102 a propagation type of natural fractures may be defined as any or all of sub-critical, critical, super-critical, or rate-independent if fracture propagation is not directly available from the site-specific data. A critical rate is defined as the rate at which a fracture will propagate stably due to the release of energy in creating the fracture surfaces being equal to the energy required to create the surfaces. A sub-critical rate is one where the energy released by fracture growth is insufficient to stably grow fractures. A super-critical rate results where more energy is released by fracture growth than is required to grow the fracture, resulting in unstable fracture growth.

At block 104 a numerical model is built that represents the earth model and incorporates therein the mechanical rock properties and fracture propagation types as previously discussed. Appropriate boundary conditions, such as stress, displacement, thermal, pore pressure, velocity, strain, point force loading, may be assigned to the numerical model using the site-specific information. Optionally, generic conditions may be used to assign boundary conditions.

Method 10 includes a Fracture risking pre-analysis procedure at block 106, which can be conducted independently of blocks 102 through 104. At pre-analysis, results from a variety of existing natural fracture prediction tools are integrated to identify potential high risk fracture regions. The existing tools include but are not limited to continuum based-forward modeling, Displacement Discontinuity Methods (DDM), elastic and geometric restoration, curvature analysis, and analytical algorithms. The pre-analyses use any of a combination of the tools, as mentioned above, to perform a screening analysis of the subsurface region (as defined at block 100) for possible occurrences of natural fractures. The results of pre-analysis are used in block 107 to identify zones having a potentially high risk of fracture. This may be illustrated by referring to FIG. 5 and FIG. 6. FIG. 5 is an exemplary earth model of a subsurface region 50 showing a variety of subsurface features such as faulting 500, mechanical layering 501, folding/bending 504, and embedded inclusion 505. Fracture risking associated with each feature can be identified using pre-analysis procedures described at blocks 106 and 107. For example, application of curvature or restoration methods to the region might identify the crest of the folding/bending feature 504 as an area where fractures are more likely to form due to high curvature or large strain patterns. Furthermore, pre-analysis may involve using DDM to identify zones or areas with high risk fracture occurrence due to faulting or slip along preexisting fractures 500 producing local areas of elevated tensile stresses. The information on preexisting fractures and faults might be available from the site-specific information obtained at block 100 and known a priori. Analytical algorithms, such as the Eshelby solution, may be used to identify areas or zones with fracture risking due to mechanical layering 501, material contrast 502, hard/stiff inclusions 505, and regional compression 507. Results from each separate pre-analysis may be superimposed to identify areas or zones with high potential of fracture occurrence. For example, extensional strain/stress that is obtained from elastic restoration analysis (due to folding) and DDM (due to faulting) can be superimposed to identify hybrid areas or zones 503 where different mechanisms might play a role in natural fracture formation.

Once the high risk fracture areas are identified at block 107, FEM-DEM zones that can fracture according to the fracture properties assigned at blocks 102 and 103 are defined within the numerical model (at block 108). In another aspect, at block 105 (FIG. 1) an initial mesh control (heterogeneity) may be prescribed to reduce mesh alignment and bias when inter-element fracturing is used (FIG. 4B). Note that when inter element fracturing 403 is activated on a regularly aligned mesh, predicted fracture progression should follow the initial mesh geometry. That is, fracture orientation becomes mesh dependent, as shown in FIG. 4B. To reduce fracture path bias due to regular alignment of elements, mesh geometry can be controlled and randomly oriented before any simulation run. Additionally, block 105 may prescribe material heterogeneity within the predefined fracture zones. In other words, elastic properties, porosity and failure properties such as tensile strength may be prescribed with a random initial heterogeneity in the initial finite element mesh.

A re-meshing operation, or a re-generating of a mesh, is performed at block 109 where mesh density is increased within a pre-defined sub-region with high fracture risk. Sub-regions with low or no fracture risk may be assigned as a continuum in those regions. This may be understood by referring to FIGS. 7A and 7B, which depicts the geologic region 60 of FIGS. 6A-C with a triangular mesh superimposed thereon. As identified from a pre-analysis operation 106, layers 700 are chosen as sub-regions of high fracture risk. These regions are assigned discrete-fracture properties, and a relatively dense mesh is used in the re-meshing process at block 109. Re-meshing may include both continuum and discrete zones as an initial step.

As shown at block 110, additional re-meshing operations may be allowed for those continuum regions that are expected to exhibit large deformations but have low fracture risk, such as layers 702, 703, and 704. At block 111 re-meshing is disabled after an initial re-mesh for the discrete regions that include high-risk fracture zones, such as layers at 700, and particularly around area 701.

Figure 7A:
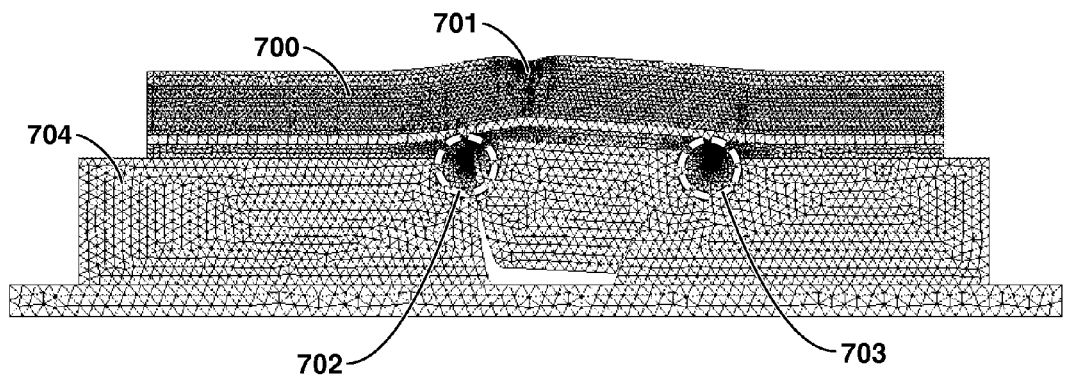
FIGS. 7A and 7B are side elevational views showing model set-up and finite element meshes.
Figure 7B:
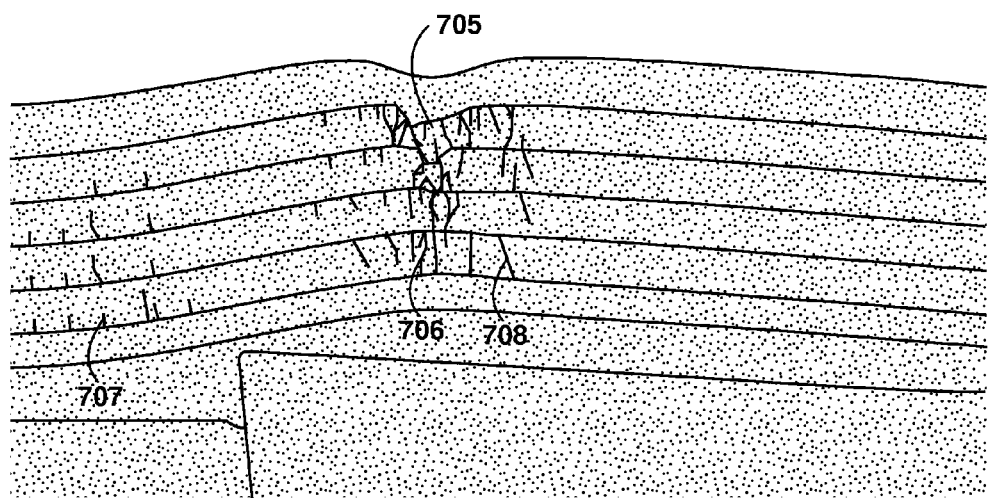

Once it is determined which parts of the geologic region to re-mesh, deformation and fracturing analysis may be carried out using an explicit FEM-DEM solver at block 112. FIGS. 7A and 7B show the deformation and fracture patterns as predicted by FEM analysis block 112. The numerical model captures the main features of deformation and might also contain information regarding fracture intensity, connectivity, length and spacing. FIG. 7B is an exemplary illustration of results from a FEM-DEM analysis. The numerical results (graphically expressed in the Figures) replicate a variety of fracture patterns and different fracturing events: layer confined fractures (708), fractures that cut through more than one layer (706), and fractures originating at layer interfaces and terminating within a single mechanical unit (707) are exemplary fracture patterns that emerge from the models. Sensitivity analysis may be performed as part of the FEM analysis by varying one or more input parameters previously defined, such as layer thickness, confining pressure, interface friction, and/or tensile strength, to see the effect on the resulting natural fracture patterns.

The deformed region of interest outputted from the FEM analysis at block 112 simulates natural fracturing and/or damage that could have occurred in the subsurface. In block 113 deformation can be compared to observations, for example from well information such as rock samples or subsurface representations, such as images, or compared to fluid flow observations, if available in the region of interest. Alternatively a practitioner conversant in the art of fracture analysis may evaluate results based on experience in other similar regions. The analysis results may be used to identify natural fracture occurrence and damage zone characteristics for a hydrocarbon reservoir. This information may then be used to make decisions regarding hydrocarbon management activities such as hydrocarbon exploration and hydrocarbon extraction. If the outcome of block 113 does not sufficiently match predicted or observed natural propagation, at block 114 method 10 may return to blocks 102, 103, and 104 where input parameters and boundary conditions may be increased or decreased until the propagation predicted by successive analyses of the model more closely matches observed natural propagation.

Fracture attributes are extracted from the FEM model results in block 115. Such attributes include, but are not limited to, fracture length, height, spacing, aperture, orientation and termination information. Additional information that may be obtained from the model analysis includes, but is not limited to, a record of model time steps when fracture propagation initiates and terminates, and whether fractures have sheared, changed their apertures, or initiated secondary fractures during model execution. Additionally, fracture surfaces may be extracted from the model as 2D or 3D objects.

The disclosed method 10 may be applied to natural fracture and damage prediction due to a variety of geologically plausible scenarios both in two dimensions (2D) and in three dimensions (3D). Aspects disclosed herein may be used to generate a 3D model in a manner similar to the 2D cross-sectional models in FIGS. 6 and 7, but where the region of interest and numerical model are defined in three spatial coordinates.

Figure 6A:
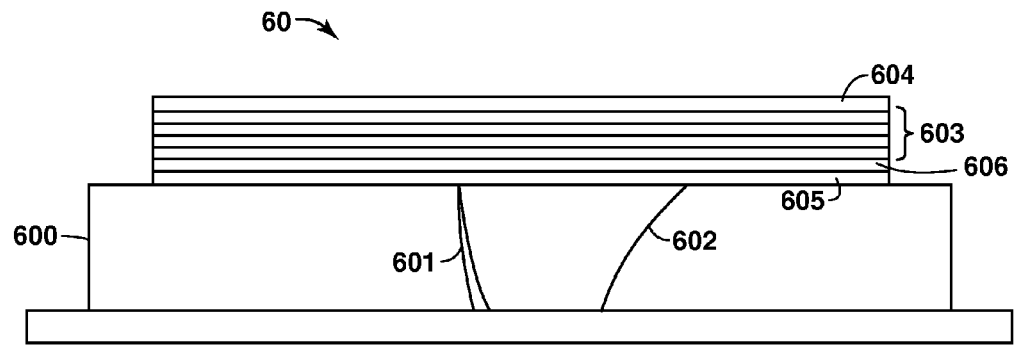
FIGS. 6A, 6B and 6C are side elevational views of a multi layer region.
Figure 6B:
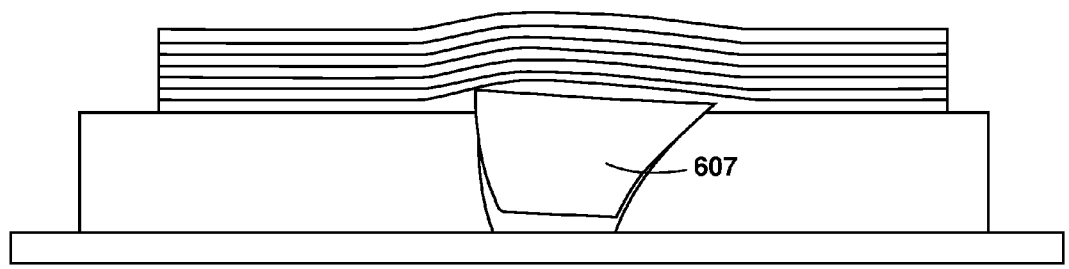
Figure 6C:
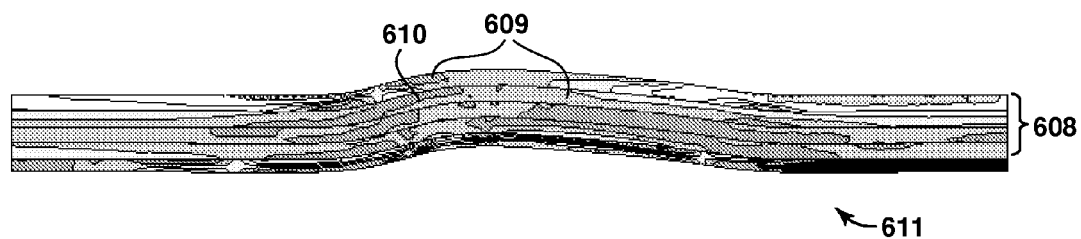

FIG. 6A is an exemplary illustration of a defined earth model as described previously in block 101 of FIG. 1. This earth model consists of a representation of geologic strata 603, 604, 605 and 606 and two underlying slip surfaces 601 and 602 representing geologic faults. Mechanical rock properties are defined for each layer 603, 604, 605 and 606 independently. FIG. 6B is an exemplary illustration of pre-analysis using a continuum finite element numerical model. In the numerical model an inward lateral pressure creates an uplift and rotation along faults 601 and 602. Layers 605 adjacent to the faulted blocks transmit the imposed motion to the overlying units as the deformation continues. Since this is a continuum based pre-analysis 106, no explicit fracturing occurs within the finite element mesh. FIG. 6C shows exemplary stress contours in stratum 611 where tensile stresses are color coded in grey, and where a darker shade of grey represents a more tensile state of stress. Regions of high tensile stress 609 and 610 may be used as a proxy for natural fracture occurrence. In this pre-analysis the entire stack of layers 608 are identified as a high risk fracture sub-region, while the regions 606 and 600 are considered low risk regions.

Figure 8A:
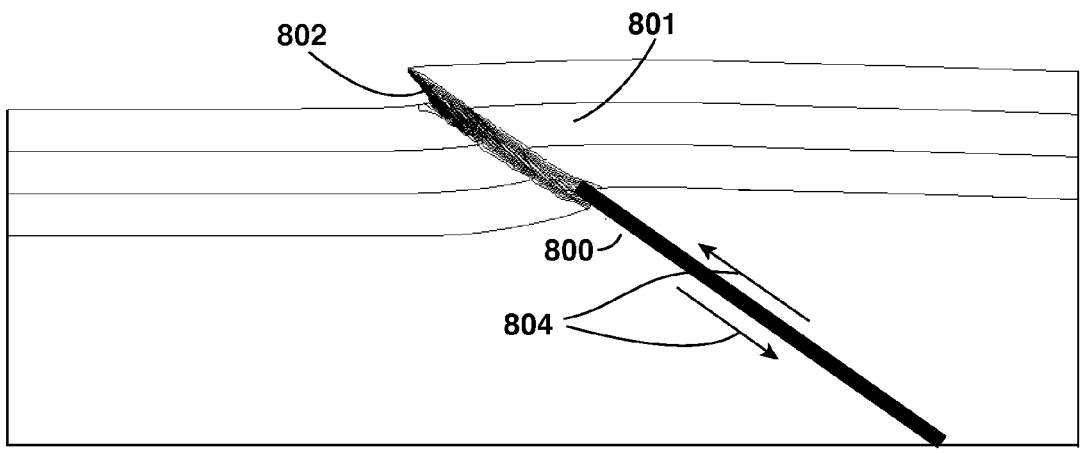
FIGS. 8A, 8B and 8C are side elevational views show realization of damage and fragmentation.
Figure 8B:
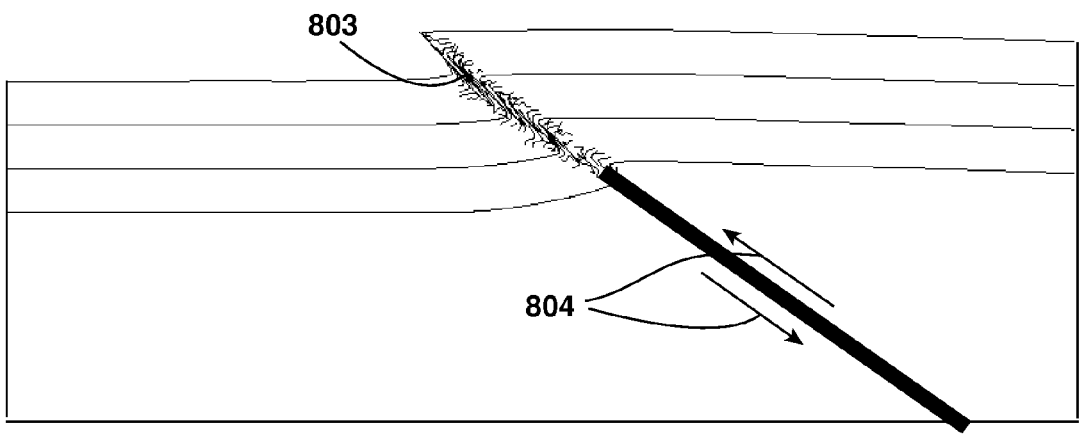
Figure 8C:
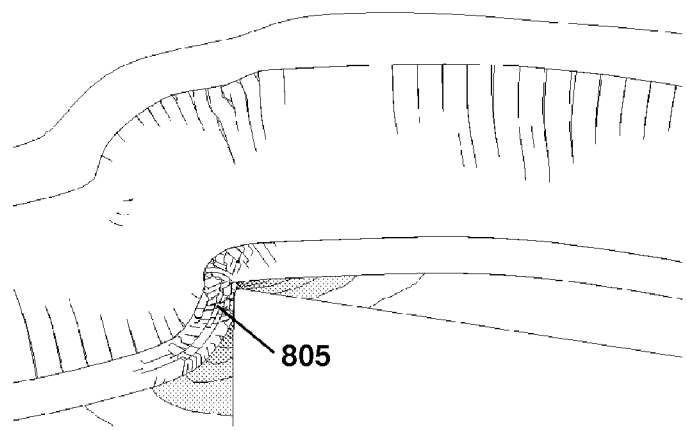

Aspects of the disclosed techniques and methodologies may be used to predict damage in a subsurface model where an area of intensely deformed rock and rock fragmentation emerges from the models. This may be useful for measuring the response of the material in a geologic region in large scale problems. Although large bulks of material have been assumed to behave similar to samples tested in a laboratory, bulk response may differ from small-scale response because of the evolution of a large number of discontinuities and associated non-homogenous stress-strain fields. Measuring such large scale bulk material response is difficult, if not impossible. In this sense simulations which incorporate discontinuities such as fractures may account for the influence of the discontinuities to deduce bulk response and large scale deformation. FIG. 8A shows an exemplary continuum based pre-analysis where contours of effective plastic strain are plotted. As shown in FIG. 8A, darker shades of gray, indicate high risk damage zones 802 (i.e. amplified plastic strain) where damage is associated with extensional deformation and parting of material planes. These zones are prone to fracturing and should be assigned discrete/fracture properties. The remaining zones, 801, are considered as having low fracture risk and can be assigned continuum properties. In FIG. 8B, as the basement deforms 804 and is uplifted, natural shear fractures are realized through the proliferation of cracks at the micromechanical level as Mode-I failure occurs only in the high-risk fracture zones. The discrete fracture surfaces at a much smaller scale coalesce to form large scale discontinuities and damage 803 along which frictional slip might be realized. Alternatively, damage can emerge from the models as a zone of intense fracturing (fragmentation) with many fracture orientations FIG. 8C illustrates such a situation, where large areas fail simultaneously due to excessive bending and/or stretching of the subsurface layers. In this case the damage zone 805 involves fragments of rock with no preferential alignment thus having fractures with many orientations.

Figure 9:
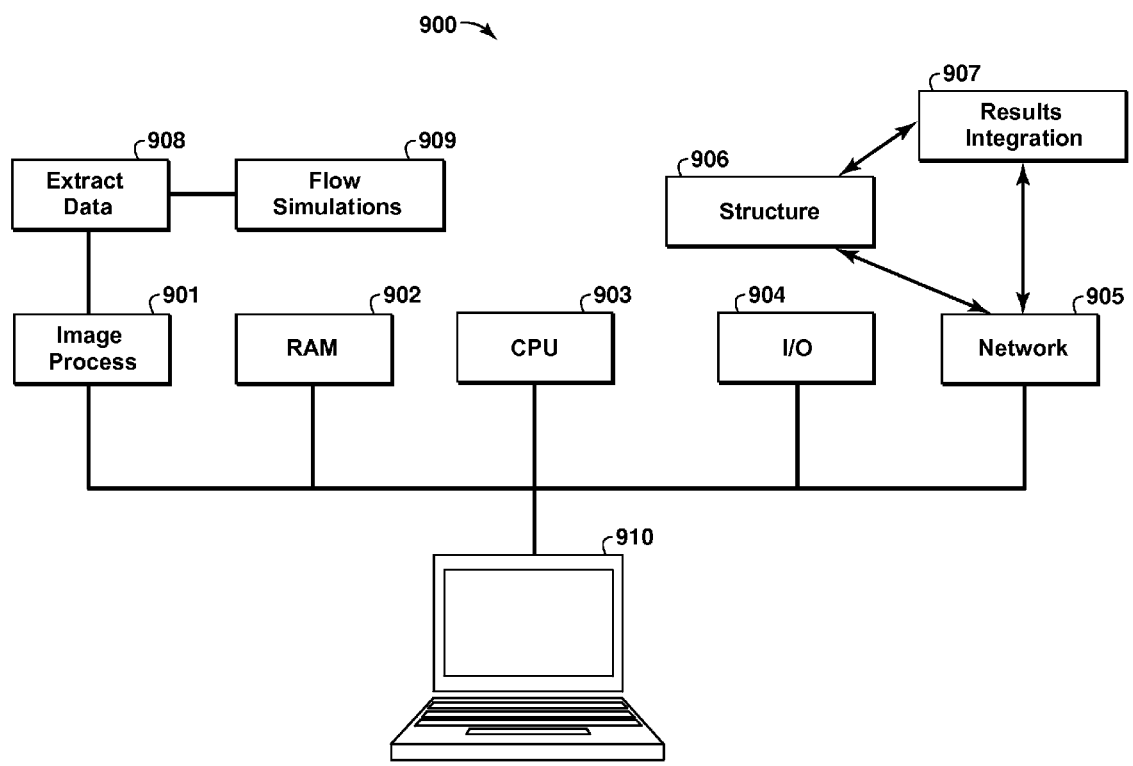
FIG. 9 is a block diagram illustrating a computer environment.

FIG. 9 illustrates a computer system 900 on which software for performing processing operations relating to aspects of the disclosed methodologies and techniques may be implemented. A central processing unit (CPU) 903 is coupled to the system. CPU 903 may be any general purpose CPU or application-specific CPU. The disclosed aspects are not restricted by the architecture of CPU 903 or other components of computer system 900. The CPU may execute the various logical instructions for performing processing according to the exemplary operational flow described in conjunction with methods disclosed herein. For example, CPU 903 may execute machine-level instructions, or machine-readable code, for performing operational blocks 109-112 of FIG. 1.

Computer system 900 may include one or more machine-readable media such as random access memory (RAM) 902. RAM 902 holds user and system data and programs, such as a computer program product containing code effectuating methods of the aspects, methodologies and techniques disclosed herein. The computer system also includes an input-output (I/O) adapter 904, a network adapter 905, and an image processing adapter/card 901 to automatically extract fracture characteristics 908 and communicate with external flow simulation programs 909. Network adapter 905 may enable a user to receive data from a specific subsurface region 906, communicate with a remote network where data is stored, and/or receive integrated results 907 of pre-analysis through the network from a remote system. Computer system 900 may also include an output device, such as a printer or display 910, to visually provide results of one or more portions of the method 10.

Figure 10A:
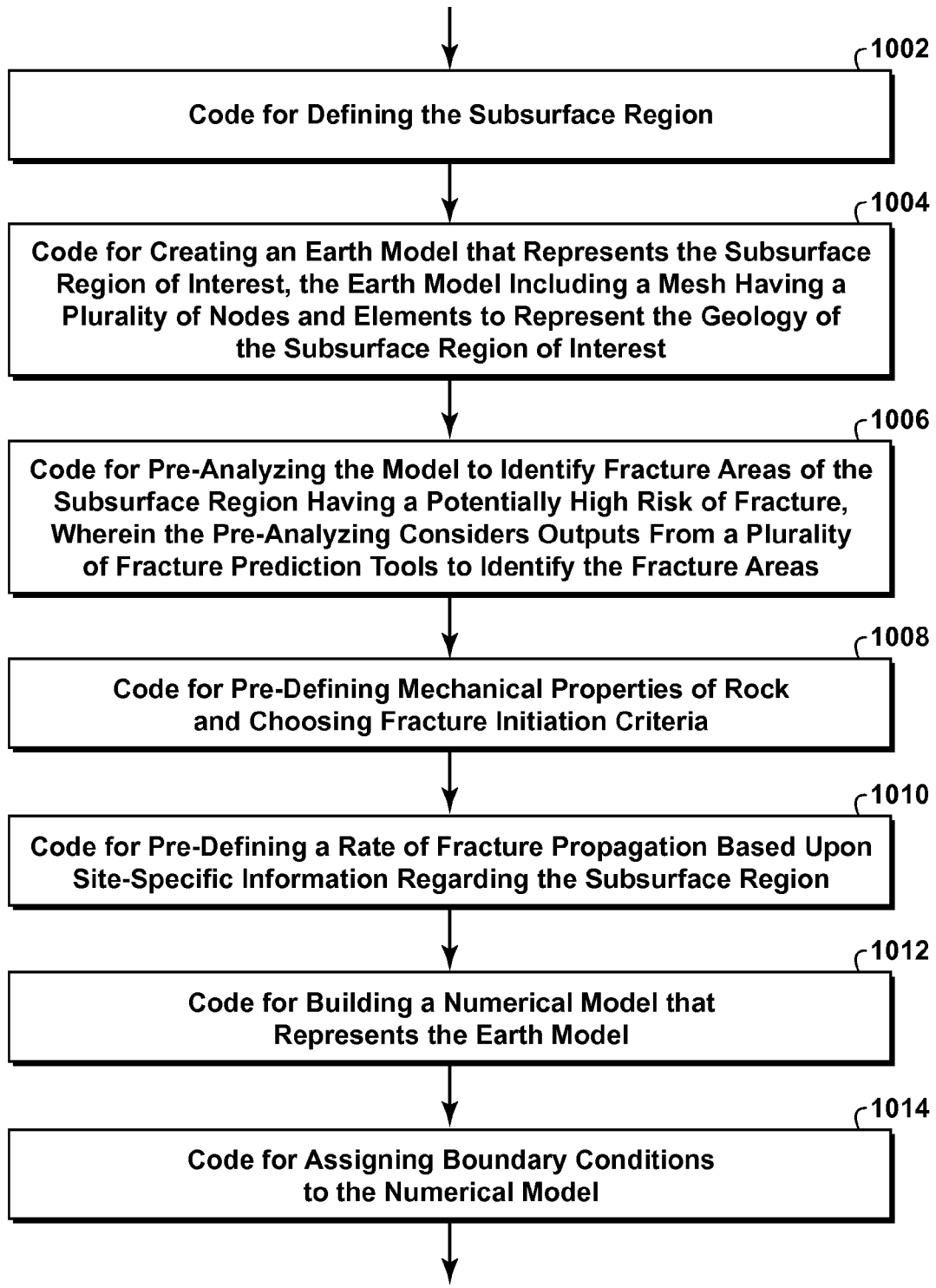
FIGS. 10A and 10B are block diagrams of machine-readable code.
Figure 10B:
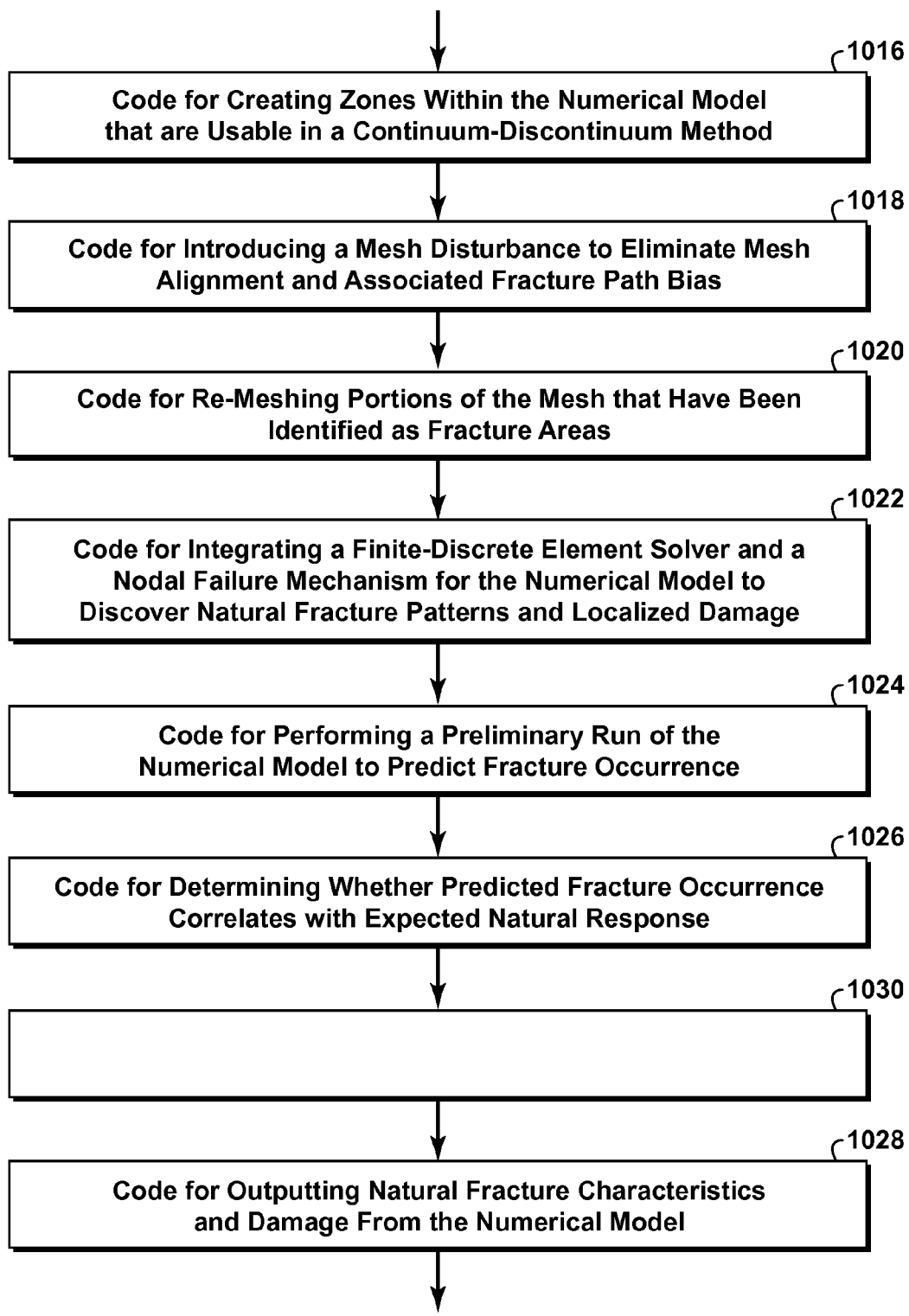

FIG. 10A and FIG. 10B show a representation of a tangible machine-readable medium 1000 incorporating machine-readable code that may be used with a computing system such as computing system 900. At block 1002 (FIG. 10A), code is provided for defining the subsurface region. At block 1004, code is provided for creating an earth model that represents the subsurface region of interest, the earth model including a mesh having a plurality of nodes and elements to represent the geology of the subsurface region of interest. At block 1006, code is provided for pre-analyzing the model to identify fracture areas of the subsurface region having a potentially high risk of fracture, wherein the pre-analyzing considers outputs from a plurality of fracture prediction tools to identify the fracture areas. At block 1008, code is provided for pre-defining mechanical properties of rock and choosing fracture initiation criteria. At block 1010, code is provided for pre-defining a rate of fracture propagation based upon site-specific information regarding the subsurface region. At block 1012, code is provided for building a numerical model that represents the earth model. At block 1014, code is provided for assigning boundary conditions to the numerical model. At block 1016 (FIG. 10B), code is provided for creating zones within the numerical model that are usable in a continuum-discontinuum method. At block 1018, code is provided for introducing a mesh control to reduce mesh alignment and associated fracture path bias. At block 1020, code is provided for re-meshing portions of the mesh that have been identified as fracture areas. At block 1022, code is provided for integrating a finite-discrete element solver and a nodal failure mechanism for the numerical model to discover natural fracture patterns and localized damage. At block 1024, code is provided for performing a preliminary run of the numerical model to predict fracture occurrence. At block 1026, code is provided for determining whether predicted fracture occurrence correlates with expected natural response. At block 1028, code is provided for outputting natural fracture characteristics and damage from the numerical model. Code effectuating or executing other features of the disclosed aspects and methodologies may be provided as well. This additional code is represented in FIG. 10 as block 1030, and may be placed at any location within the machine-readable code according to computer code programming techniques.

Figure 11:
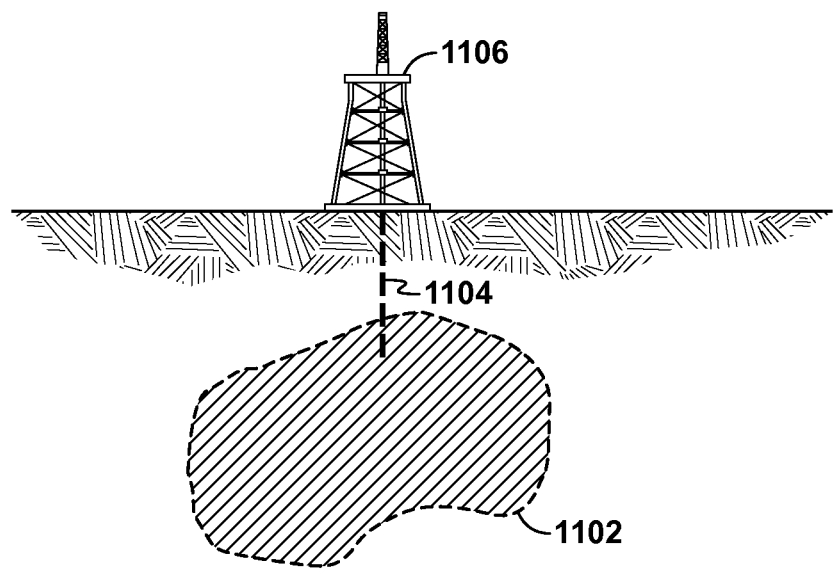
FIG. 11 is a side elevational view of a hydrocarbon management activity.
Figure 12:
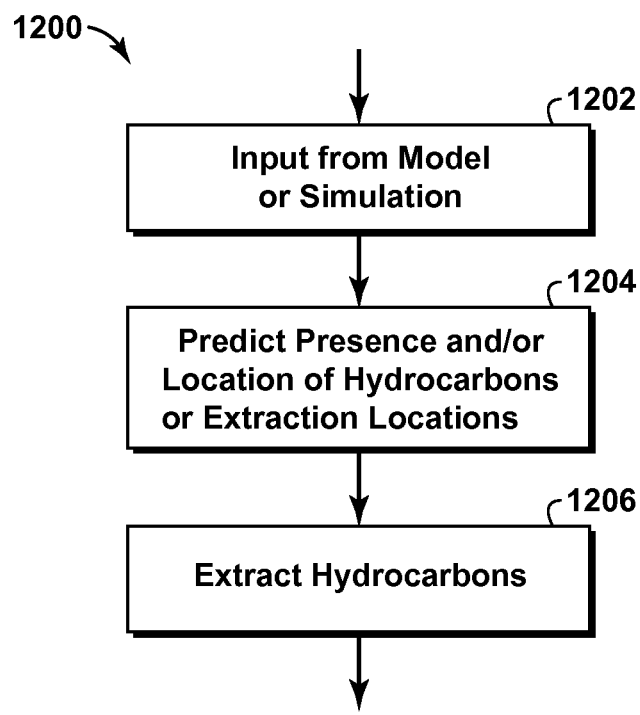
FIG. 12 is a flowchart of a method of extracting hydrocarbons from a subsurface region.

Aspects disclosed herein may be used to perform hydrocarbon management activities such as extracting hydrocarbons from a subsurface region or reservoir, which is indicated by reference number 1102 in FIG. 11. A method 1200 of extracting hydrocarbons from subsurface reservoir 1102 is shown in FIG. 12. At block 1202 inputs are received from a numerical model, geologic model, or flow simulation of the subsurface region, where the model or simulation has been improved using the methods and aspects disclosed herein. At block 1204 the presence and/or location of hydrocarbons in the subsurface region is predicted, or alternatively an extraction location may be predicted or estimated. At block 1206 hydrocarbon extraction is conducted to remove hydrocarbons from the subsurface region, which may be accomplished by drilling a well 1104 using oil drilling equipment 1106 (FIG. 11). Other hydrocarbon management activities may be performed according to known principles.

Application of FEM-DEM in an integrated workflow for predicting natural fractures can both qualitatively and quantitatively simulate the evolution of natural fractures as well as their influence on global load-displacement response in terms of additional degrees of freedom and material response with the aid of preexisting natural fracture prediction tools. Aspects of disclosed techniques benefit from a pre-analysis of the region of interest by using continuum, discrete, restoration, maximum curvature and analytical tools. For a specific region, potential natural fracture occurrence (i.e. fracture risking) or damage can be evaluated by superposition of the results from any of the aforementioned tools or their all possible combinations. In particular the disclosed aspects help to identify high-risk fracture zones that are to be assigned DEM-fracture properties, and relatively low-risk fracture zones that will remain intact (i.e. FEM-continuum properties) throughout the analysis. Furthermore, continuum response can be modeled with sophisticated elasto-plastic constitutive laws while the introduction of discrete discontinuities within high-fracture-risk regions allows the additional deformation to be distributed in much more energy efficient way than it is possible in a continuum model. Specifically, discontinuities redistribute the stresses/strains in their respective vicinities and alter the material response that affects the overall deformation.

According to aspects disclosed herein, natural fracture occurrence is predicted by combining mechanically driven factors due to a variety of scenarios (e.g. both tensile and compressive), with different fracture initiation, propagation and softening laws. This allows the user to avoid crack tip complexities and offers an approach that is applicable at a variety of scales. Even without the prior knowledge of pre-existing microflaws, realistic natural fracture patterns emerge from the numerical simulations. Disclosed aspects are beneficial for predicting damage even where zones of intense fracturing and fragmentation are predicted from the models.

According to other disclosed aspects, large-scale regions such as faults can be realized from coalescence of opening mode natural fractures at much smaller scales. Furthermore, slip along emerging faults might promote additional fractures and damage in the subsurface. This does not require predefining or preconditioning the fault orientation or geometry. If desired, initial material properties for each element (e.g. tensile strength, pore pressure) may be distributed following a probability distribution.

As a summary, the disclosed aspects and techniques permits prediction of natural fracture characteristics and damage due to a variety of geologically plausible scenarios, using a new integrated workflow with focus on mechanically driven factors rather than micromechanics. The simulations might start from an initially intact stage and quasi-brittle failure is formulated in a continuum/discrete element framework. That is, failed material goes under a continuum-discrete transition where orientation and itinerary is not known a priori. Discontinuities initiate and propagate throughout the deformation if the stress state dictates that they should. Since the focus is on macro-mechanical loading conditions rather than crack tip micromechanics, the disclosed methodologies and techniques are appropriate for solving both small and large scale problems for natural fracture prediction and damage.

The disclosed aspects, methodologies and techniques may be susceptible to various modifications, and alternative forms and have been shown only by way of example. The disclosed aspects, methodologies and techniques are not intended to be limited to the specifics of what is disclosed herein, but include all alternatives, modifications, and equivalents falling within the spirit and scope of the appended claims.

What is claimed is:

1. A method of predicting fractures in a subsurface region, the method comprising:

defining the subsurface region;

creating an earth model that represents the subsurface region, the earth model including a mesh having a plurality of nodes and elements to represent the geology of the subsurface region;

pre-analyzing the model to identify fracture areas of the subsurface region having a potentially high risk of fracture, wherein the pre-analyzing comprises identifying fracture areas based on outputs from a plurality of fracture prediction tools;
pre-defining mechanical properties of rock and choosing fracture initiation criteria;
pre-defining a rate of fracture propagation based upon site-specific information regarding the subsurface region;
building a numerical model that represents the earth model;
assigning boundary conditions to the numerical model;
creating zones within the numerical model that are usable in a continuum-discontinuum method;
introducing a mesh control to reduce mesh alignment and associated fracture path bias;
re-meshing portions of the mesh that have been identified as fracture areas;
integrating a finite-discrete element solver and a nodal failure mechanism for the numerical model to discover natural fracture patterns and localized damage;
performing a preliminary run of the numerical model to predict fracture occurrence;
determining whether predicted fracture occurrence correlates with expected natural response; and
outputting natural fracture characteristics and damage from the numerical model.

2. The method of claim 1, wherein pre-analyzing the numerical model comprises identifying fracture areas by analyzing an equivalent form of the subsurface model where no fracturing is allowed, using at least one of a forward continuum model, elastic restoration, geometric restoration, displacement discontinuity methods, maximum curvature analysis, and analytical solutions.

3. The method of claim 1, further con sing assigning discrete fracture properties to the fracture areas.

4. The method of claim 2, wherein predicting natural fractures is performed by identifying at least one of regions of zero tensile strength, plastic or elastic strain localizations, and amplified tensile/compressive stresses.

5. The method of claim 2, wherein fracture areas include at least one of regions with elevated pore pressures, regions with preexisting faults, regions with increased curvature, regions with vertical stacks of heterolithic layers of rock, regions with uplift and exhumation, regions with low mean stress, regions with tensile stress, and regions with thermally induced stresses.

6. The method of claim 1, further comprising re-meshing areas predicted to exhibit deformation and that have high fracture risk compared to other areas of the subsurface region.

7. The method of claim 1, wherein the re-meshing is an initial re-meshing performed to increase the density of the mesh and to control mesh alignment in the vicinity of potential high risk fracture areas.

8. The method of claim 1, further comprising:
adjusting parameters relating to at least one of the subsurface region of interest, mechanical properties of rock, fracture initiation criteria, the rate of fracture propagation, and the boundary conditions when predicted fracture occurrence does not correlate with expected natural response; and
performing one or more additional preliminary runs of the numerical model using the adjusted parameters.

9. The method of claim 1, wherein assigning the boundary conditions comprises simulating mechanically driven factors including at least one of folding, faulting, compression of vertically stacked layers, elevated pore pressures, regional compression, regional extension, thermal loading, uplift, and exhumation; and assigning the boundary conditions based at the simulation.

10. The method of claim 1 wherein the failure mechanism incorporates an advanced constitutive model for intact rock that simulates fracturing under tensile, compressive or a combination of tensile-compressive regimes, and predicts formation of damage when criteria for predicting a fracture are satisfied.

11. The method of claim 10, further comprising decreasing tensile strength of elements as damage increases until energy needed to form a discrete fracture is released.

12. The method of claim 1, wherein fracture initiation criteria includes at least one of critical stress intensity, minimum energy density, maximum tensile strength, and critical energy release rate.

13. The method of claim 1, wherein defining the subsurface region comprises defining a material property that is at least one of elastic and elasto-plastic.

14. The method of claim 1, wherein the site-specific information is at least one of tensile strength and critical energy release rate.

15. The method of claim 1, wherein the boundary conditions are at least one of stress, strain, force, displacement, and thermal loading.

16. The method of claim 1, further comprising distributing mechanical and fracture properties, with a random initial heterogeneity, within the fracture areas to introduce material heterogeneity therein.

17. The method of claim 16, wherein the material heterogeneity is defined by specifying randomly distributed elastic properties, porosity, and tensile strength within the mesh.

18. The method of claim 1, further comprising introducing one or more microflaws with a random distribution of at least one of length spacing, aperture, and orientation.

19. The method of claim 1, wherein natural fracture patterns, comprising at least one of spacing, aperture, length, connectivity, and intensity, are extracted from the numerical model after the preliminary run is performed.

20. A computer program product, comprising a computer usable non-transitory medium having a computer readable code embodied therein, the computer readable code adapted to be executed to implement a method for natural fracture and damage prediction in a subsurface region, the method comprising:
defining the subsurface region;
creating an earth model that represents the subsurface region of interest, the earth model including a mesh having a plurality of nodes and elements to represent the geology of the subsurface region of interest;
pre-analyzing the model to identify fracture areas of the subsurface region having a potentially high risk of fracture, wherein the pre-analyzing comprises identifying fracture areas based on outputs from a plurality of fracture prediction tools;
pre-defining mechanical properties of rock and choosing fracture initiation criteria;
pre-defining a rate of fracture propagation based upon site-specific information regarding the subsurface region;
building a numerical model that represents the earth model;
assigning boundary conditions to the numerical model;
creating zones within the numerical model that are usable in a continuum-discontinuum method;
introducing a mesh control to reduce mesh alignment and associated fracture path bias;

re-meshing portions of the mesh that have been identified as fracture areas;

integrating a finite-discrete element solver and a nodal failure mechanism for the numerical model to discover natural fracture patterns and localized damage;

performing a preliminary run of the numerical model to predict fracture occurrence;

determining whether predicted fracture occurrence correlates with expected natural response; and outputting natural fracture characteristics and damage from the numerical model.

21. A method of managing hydrocarbon resources, comprising:

defining a subsurface region;

creating an earth model that represents the subsurface region, the earth model including a mesh having a plurality of nodes and elements to represent the geology of the subsurface region;

pre-analyzing the model to identify fracture areas of the subsurface region having a potentially high risk of fracture, wherein the pre-analyzing comprises identifying fracture areas based on outputs from a plurality of fracture prediction tools;

pre-defining mechanical properties of rock and choosing fracture initiation criteria;

pre-defining a rate of fracture propagation based upon site-specific information regarding the subsurface region;

building a numerical model that represents the earth model;

assigning boundary conditions to the numerical model;

creating zones within the numerical model that are usable in a continuum-discontinuum method;

introducing a mesh control to reduce mesh alignment and associated fracture path bias;

re-meshing portions of the mesh that have been identified as fracture areas;

integrating a finite-discrete element solver and a nodal failure mechanism for the numerical model to discover natural fracture patterns and localized damage;

performing a preliminary run of the numerical model to predict fracture occurrence;

determining whether predicted fracture occurrence correlates with expected natural response; and managing hydrocarbons based on an output of predicted natural fracture characteristics and damage from the numerical model.

* * * * *